US011578408B2

(12) United States Patent
Kamio et al.

(10) Patent No.: US 11,578,408 B2
(45) Date of Patent: Feb. 14, 2023

(54) GAS PROCESSING APPARATUS

(71) Applicant: TOKYO ELECTRON LIMITED, Tokyo (JP)

(72) Inventors: Takashi Kamio, Nirasaki (JP); Yu Nunoshige, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 368 days.

(21) Appl. No.: 16/035,817

(22) Filed: Jul. 16, 2018

(65) Prior Publication Data

US 2019/0024234 A1 Jan. 24, 2019

(30) Foreign Application Priority Data

Jul. 24, 2017 (JP) .............................. JP2017-142838

(51) Int. Cl.
*C23C 16/455* (2006.01)
*H01L 21/67* (2006.01)
(Continued)

(52) U.S. Cl.
CPC .. *C23C 16/45565* (2013.01); *C23C 16/45544* (2013.01); *C23C 16/45561* (2013.01);
(Continued)

(58) Field of Classification Search
CPC ......... H01J 37/323244; H01J 37/32449; H01J 37/3244; C23C 16/45563–45578;
(Continued)

(56) References Cited

U.S. PATENT DOCUMENTS 6,302,965 B1* 10/2001 Umotoy ............ C23C 16/45576
118/715
2003/0070761 A1* 4/2003 Turlot ................ C23C 16/5096
156/345.47
(Continued)

FOREIGN PATENT DOCUMENTS

JP H11-297681 A 10/1999
JP 2014-70249 A 4/2014
(Continued)

*Primary Examiner* — Benjamin Kendall
*Assistant Examiner* — Kurt Sweely
(74) *Attorney, Agent, or Firm* — Nath, Goldberg & Meyer; Jerald L. Meyer; Tanya E. Harkins

(57) ABSTRACT

A gas processing apparatus includes: a mounting part; a gas supply part located above the mounting part and having a plurality of first gas supply holes; a gas supply path forming part configured to form a supply path of a processing gas, the gas supply path forming part including a flat opposing surface which faces the gas supply part from above and defines a first diffusion space for diffusing the processing gas in a lateral direction; a recess surrounding a central portion of the opposing surface; and a plurality of gas dispersion portions located in the recess surrounding the central portion of the opposing surface without protruding from the opposing surface, each of the plurality of gas dispersion portions having a plurality of gas discharge holes extending along a circumferential direction so as to laterally disperse the processing gas supplied from the supply path in the first diffusion space.

10 Claims, 17 Drawing Sheets

(51) Int. Cl.
*C23C 16/44* (2006.01)
*C23C 16/458* (2006.01)

(52) U.S. Cl.
CPC .... *H01L 21/67017* (2013.01); *C23C 16/4412* (2013.01); *C23C 16/4586* (2013.01); *C23C 16/45525* (2013.01)

(58) Field of Classification Search
CPC ........ C23C 16/45544; C23C 16/45561; C23C 16/45565; C23C 16/4586; C23C 16/45502; C23C 16/45504; C23C 16/45506; C23C 16/45508; C23C 16/4551; C23C 16/45512; C23C 16/45514; C23C 16/45559; C23C 16/45568; C23C 16/45557; C23C 16/45572; C23C 16/45574; C23C 16/4558; C23C 16/45582; C23C 16/45585; C23C 16/4412; C23C 16/455–45517; C23C 16/45525–45553; C23C 16/45587; C23C 16/45591; C23C 16/52; H01L 21/67063; H01L 21/67069; H01L 21/6719; H01L 21/67253; H01L 21/67288; H01L 21/67017

See application file for complete search history.

(56) References Cited

U.S. PATENT DOCUMENTS

| | | | |
|---|---|---|---|
| 2008/0035169 A1* | 2/2008 | Farmakis | H01J 37/32357 134/1.1 |
| 2010/0310772 A1* | 12/2010 | Tsuda | C23C 16/45563 427/255.28 |
| 2014/0090599 A1* | 4/2014 | Saitou | B05B 1/005 118/728 |
| 2015/0187593 A1* | 7/2015 | Narushima | H01L 21/67069 438/735 |
| 2015/0267298 A1* | 9/2015 | Saitou | C23C 16/34 118/725 |

FOREIGN PATENT DOCUMENTS

| | | |
|---|---|---|
| KR | 10-2010-0124198 A | 11/2010 |
| KR | 10-1745074 B1 | 9/2015 |

* cited by examiner

Evaluation test 1-1
Purge flow rate: small

Evaluation test 1-2
Purge flow rate: large

Comparative test 1-1
Purge flow rate: small

Comparative test 1-2
Purge flow rate: large

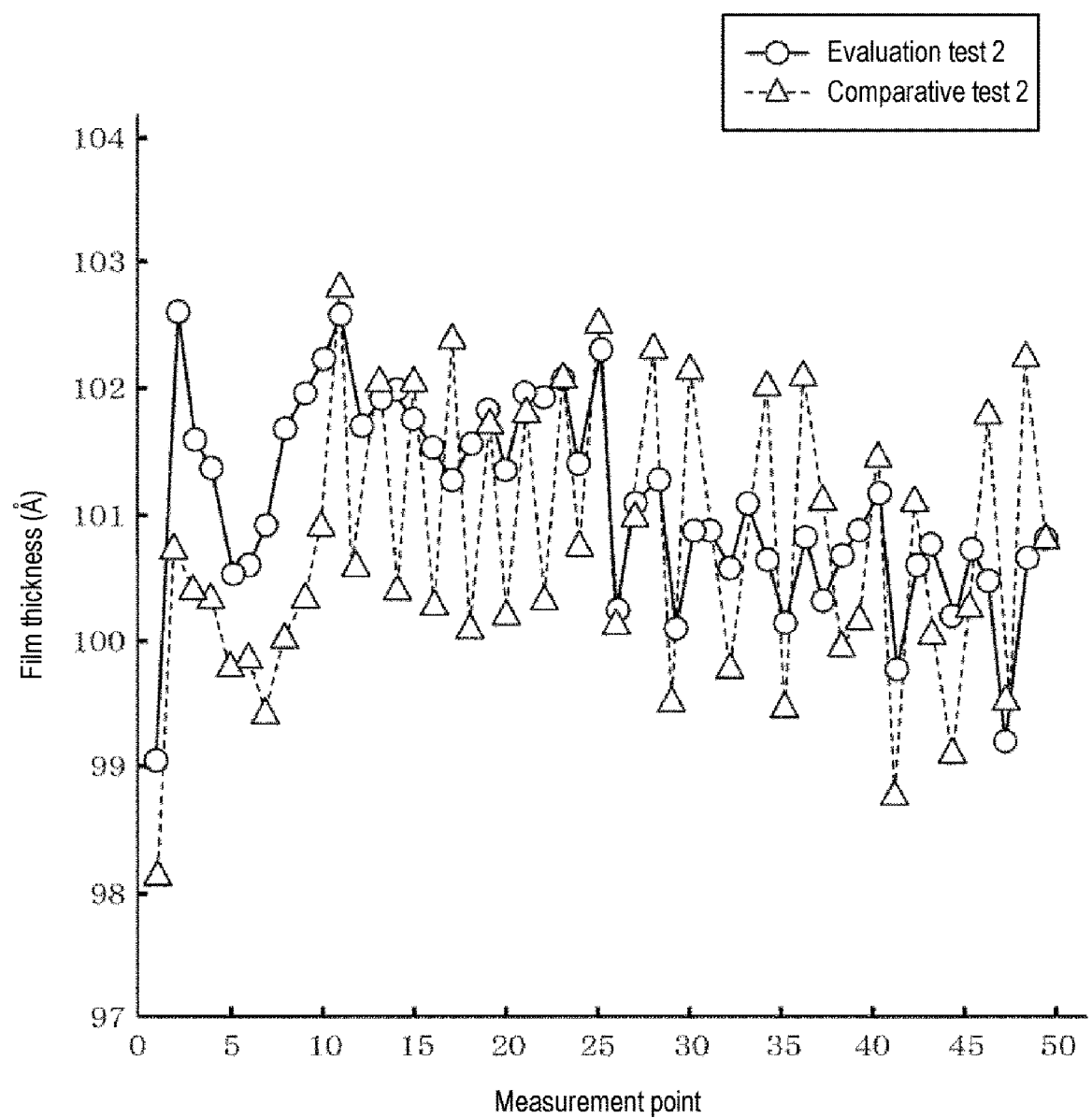

GAS PROCESSING APPARATUS

CROSS-REFERENCE TO RELATED APPLICATION

This application is based upon and claims the benefit of priority from Japanese Patent Application No. 2017-142838, filed on Jul. 24, 2017, the entire contents of which are incorporated herein by reference.

TECHNICAL FIELD

The present disclosure relates to a gas processing apparatus for performing gas processing on a substrate in a processing container kept in a vacuum atmosphere.

BACKGROUND

In some cases, for example, film formation by ALD (Atomic Layer Deposition) is used as gas processing for a semiconductor wafer (hereinafter referred to as ""wafer"") which is a substrate. In the ALD, a raw material gas adsorbed on the surface of the wafer and a reaction gas reacting with the raw material gas are alternately supplied a plurality of times in a processing container kept in a vacuum atmosphere, whereby an atomic layer of a reaction product is deposited on the surface of the wafer to form a film. A purge gas is supplied between the time in which the raw material gas is supplied and the time in which the reactant gas is supplied.

It is required that a film forming apparatus for performing the ALD be configured to form a film with a film thickness having high uniformity in the plane of the wafer. As an apparatus that complies with such a requirement, for example, there is known an apparatus including a plurality of gas supply parts on an opposing surface that faces a wafer mounting table. Each of the gas supply parts has a discharge port for discharging a gas in a circumferential direction, thereby laterally diffusing the gas in a diffusion space partitioned above the mounting table. The gas diffused in this way is supplied to the wafer in a shower shape from a large number of discharge holes opened in a plate forming the bottom portion of the diffusion space.

Consideration has been made to further increase the uniformity of film thickness in the plane of the wafer. For that purpose, with respect to the film forming apparatus having the gas supply parts and the diffusion space, further increase in the uniformity of the concentration of the gas supplied to the diffusion space has been considered. Furthermore, with respect to the film forming apparatus having the gas supply parts and the diffusion space, there has been consideration given to discharging a purge gas from the gas supply parts at a relatively large flow rate within a relatively short time to promptly purge the raw material gas and the reaction gas, thereby improving the throughput of the apparatus. Even when the purging is performed in this way, there is a demand for a technique capable of increasing the uniformity of the concentration of the gas in the diffusion space and forming a film on the wafer with high film thickness uniformity.

SUMMARY

Some embodiments of the present disclosure provide a technique capable of performing gas processing with high uniformity in the plane of a substrate.

According to one embodiment of the present disclosure, a gas processing apparatus, which performs a process by supplying a processing gas to a substrate in a processing chamber kept in a vacuum atmosphere, includes: a mounting part located in the processing chamber and configured to mount the substrate on the mounting part; a gas supply part located above the mounting part to constitute a ceiling portion of the processing chamber, the gas supply part having a plurality of first gas supply holes for supplying the processing gas in a shower shape; a gas supply path forming part configured to form a supply path of the processing gas, the gas supply path forming part including a flat opposing surface which faces the gas supply part from above and defines a first diffusion space for diffusing the processing gas in a lateral direction; a recess surrounding a central portion of the opposing surface; and a plurality of gas dispersion portions located in the recess surrounding the central portion of the opposing surface without protruding from the opposing surface, each of the plurality of gas dispersion portions having a plurality of gas discharge holes extending along a circumferential direction so as to laterally disperse the processing gas supplied from the supply path in the first diffusion space.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 20 is a graph showing the results of evaluation tests.

DETAILED DESCRIPTION

Figure 1:
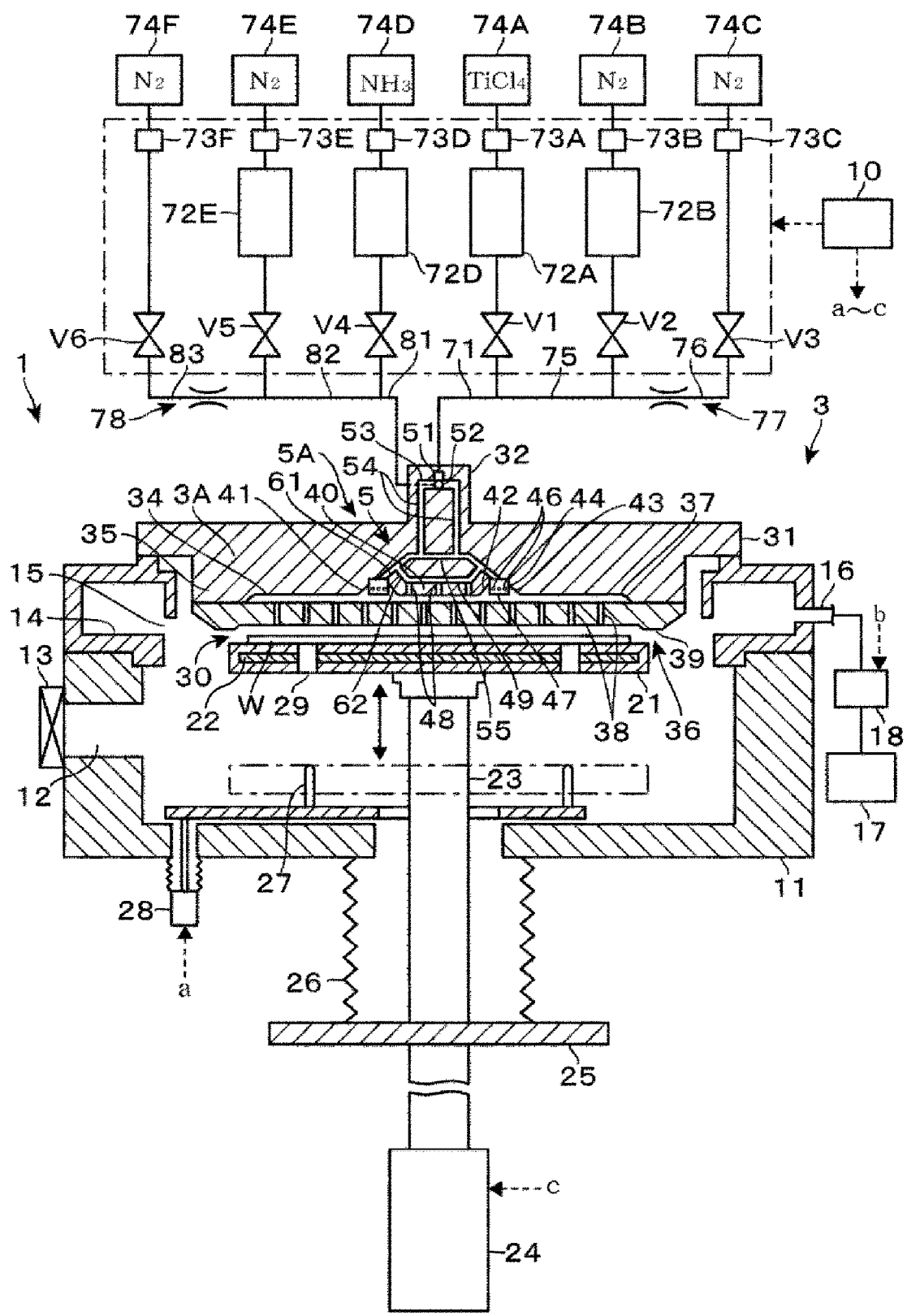
FIG. 1 is a vertical sectional side view of a film forming apparatus according to the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming apparatus 1 which is an embodiment of a gas processing apparatus of the present disclosure will be described with reference to a vertical sectional side view of FIG. 1. The film forming apparatus 1 is provided with a flat circular processing container 11. A vacuum atmosphere is formed in the processing container 11, and a wafer W which is a circular substrate having a diameter of, for example, 300 mm, is stored in the processing container 11. The film forming apparatus 1 alternately and repeatedly supplies a $TiCl_4$ (titanium tetrachloride) gas as a raw material gas and an $NH_3$ (ammonia) gas as a reaction gas to the wafer W to perform ALD, thereby forming a TiN (titanium nitride) film. An $N_2$ (nitrogen) gas, which is an inert gas, is supplied as a purge gas between the time zone in which the $TiCl_4$ gas is supplied and the time zone in which the $NH_3$ gas is supplied, whereby the atmosphere in the processing container 11 is converted from a $TiCl_4$ gas atmosphere or an $NH_3$ gas atmosphere to an $N_2$ gas atmosphere. During the film forming process by ALD, an $N_2$ gas is continuously supplied into the processing container 11 as a carrier gas for introducing the $TiCl_4$ gas and the $NH_3$ gas into the processing container 11.

A wafer loading/unloading port 12 and a gate valve 13 for opening and closing the loading/unloading port 12 are provided on the side wall of the processing container 11. On the upper side of the loading/unloading port 12, there is provided an exhaust duct 14 which constitutes a part of the side wall of the processing container 11 and which is formed by bending a duct having a square vertical cross section in an annular shape. On the inner circumferential surface of the exhaust duct 14, a slit-shaped opening 15 extending along the circumferential direction is formed to constitute an exhaust port of the processing container 11.

One end of an exhaust pipe 16 is connected to the exhaust duct 14. The other end of the exhaust pipe 16 is connected to an exhaust mechanism 17 constituted by a vacuum pump. In the exhaust pipe 16, there is provided a pressure regulation mechanism 18 constituted by, for example, a pressure regulation valve. The opening degree of the pressure regulation valve is adjusted based on a control signal output from a controller 10 described later so that the pressure inside the processing container 11 becomes a desired vacuum pressure.

Reference numeral 21 in FIG. 1 denotes a circular horizontal mounting table provided inside the processing container 11 to mount a wafer W thereon. The wafer W is mounted on the mounting table 21 so that the center of the wafer W is aligned with the center of the mounting table 21. A heater 22 is buried in the mounting table 21 that constitutes a mounting part. The heater 22 heats the wafer W to, for example, 400 degrees C. to 700 degrees C. The upper end of a support member 23 passing through the bottom portion of the processing container 11 and extending in the vertical direction is connected to the central portion of the lower surface of the mounting table 21. The lower end of the support member 23 is connected to an elevating mechanism 24. By means of the elevating mechanism 24, the mounting table 21 can be moved up and down between a lower position indicated by a chain line in FIG. 1 and an upper position indicated by a solid line in FIG. 1. The lower position is a delivery position for transferring the wafer W to and from a wafer transfer mechanism that enters the processing container 11 from the loading/unloading port 12. The upper position is a processing position where processing is performed on the wafer W.

Reference numeral 25 in FIG. 1 denotes a flange provided on the support member 23 below the bottom portion of the processing container 11. Reference numeral 26 in FIG. 1 denotes a telescopic bellows. The upper end of bellows 26 is connected to the bottom portion of the processing container 11, and the lower end of the bellows 26 is connected to the flange 25, thereby ensuring the air tightness of the interior of the processing container 11. Reference numeral 27 in FIG. 1 denotes three support pins (only two of which are shown in FIG. 1), and reference numeral 28 in FIG. 1 denotes a lifting mechanism for moving the support pins 27 up and down. When the mounting table 21 is positioned at the delivery position, the support pins 27 are raised and lowered through the through holes 29 provided in the mounting table 21 to protrude and retract on the upper surface of the mounting table 21. Thus, the delivery of the wafer W is performed between the mounting table 21 and the transport mechanism.

A gas supply path forming part 3 is provided above the exhaust duct 14 so as to close the inside of the processing container 11 from the upper side. The gas supply path forming part 3 includes a main body portion 31 and a gas introduction portion 32. The main body portion 31 is formed as a flat circular block. The peripheral edge portion of the main body portion 31 is provided along the exhaust duct 14 and is supported by the exhaust duct 14. The gas introduction portion 32 is formed by expanding a radially extending portion of the upper surface of the main body portion 31 so as to protrude upward.

Figure 2:
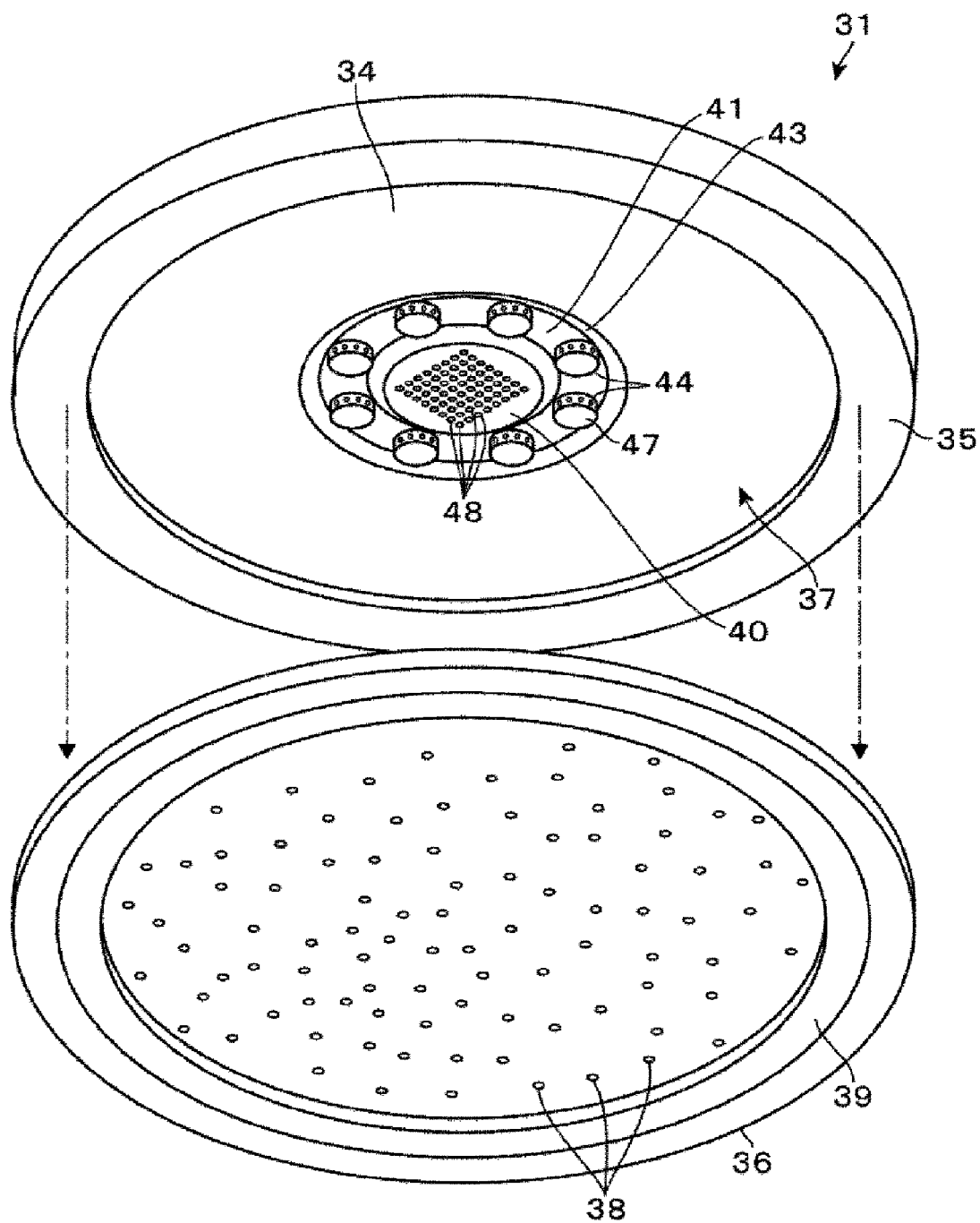
FIG. 2 is a perspective view of a flow path forming part constituting the film forming apparatus.

Describing the main body portion 31 in more detail, the central lower portion of the main body portion 31 protrudes toward the mounting table 21 inside the processing container 11, thereby forming a circular protruding portion 3A. The central portion of the lower surface of the protruding portion 3A is configured as a circular opposing surface 34 facing a below-described shower plate 36 from above. Hereinafter, description will be made with reference also to FIG. 2 which is a bottom perspective view of the main body portion 31 showing the opposing surface 34. In the protruding portion 3A, the outer peripheral region of the opposing surface 34 further protrudes downward to form an annular projection portion 35. The lower end of the projection portion 35 is connected to the peripheral edge portion of the shower plate 36.

The shower plate 36 is horizontally provided and is formed in a circular shape. The peripheral edge of the shower plate 36 is formed along projection portion 35. The shower plate 36 faces the mounting table 21 and constitutes a ceiling of the processing container 11. A flat circular gas diffusion space 37 surrounded by the projection portion 35, the shower plate 36 and the opposing surface 34 is defined.

The center of the diffusion space 37 is located above the center of the mounting table 21. A large number of gas supply holes 38 perforated in the thickness direction of the shower plate 36 are dispersedly disposed in the shower plate 36. As described later, the gas supplied to the diffusion space 37 as a first diffusion space is supplied in a shower shape from the gas supply holes 38 forming first gas supply holes to the wafer W mounted on the mounting table 21. Reference numeral 39 in FIG. 1 denotes an annular projection provided on the lower surface of the shower plate 36 so as to protrude downward along the peripheral edge portion of the shower plate 36. As shown in FIG. 1, the annular projection 39 is close to the peripheral edge portion of the mounting table 21 at the processing position. The space sandwiched by the shower plate 36 and the mounting table 21 inside the annular projection 39 kept close to the mounting table 21 in this way is configured as a processing space 30 for processing the wafer W.

Figure 3:
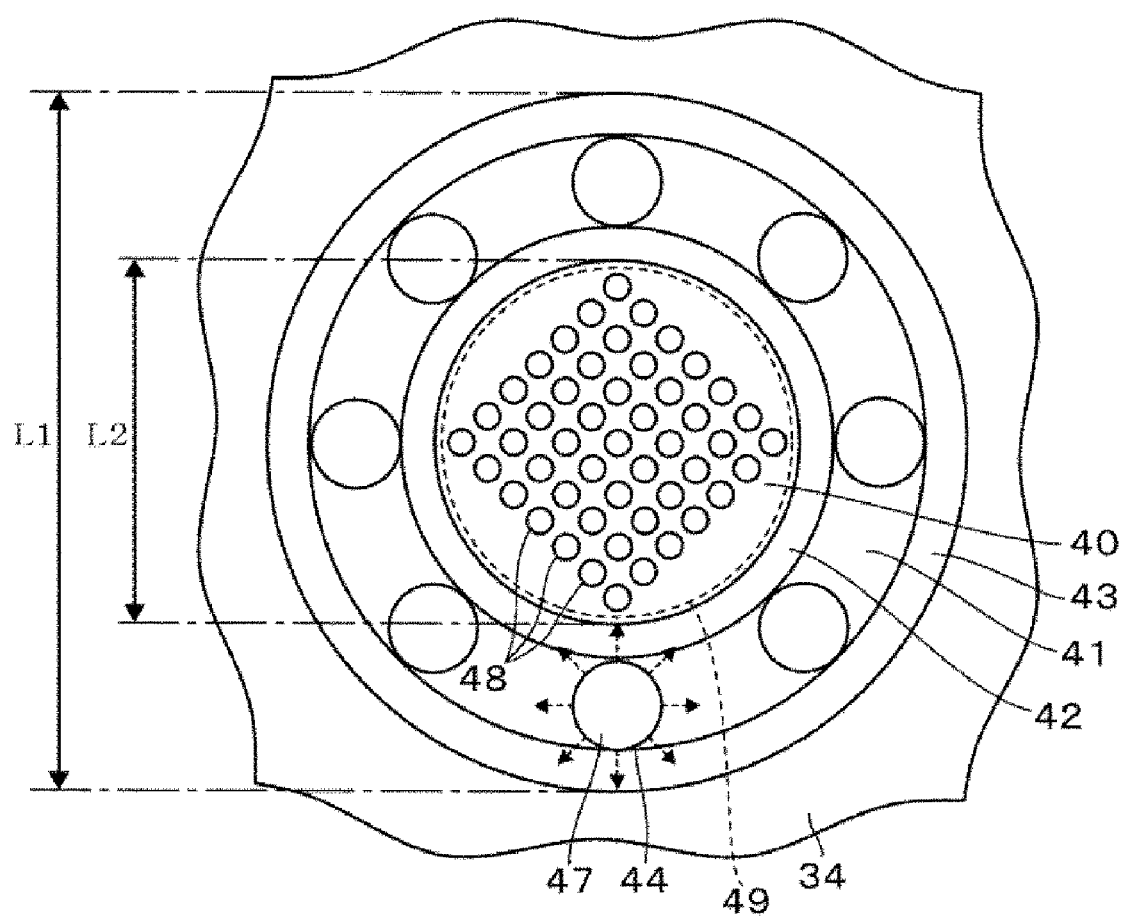
FIG. 3 is a plan view of an opposing surface provided in the flow path forming part.
Figure 4:
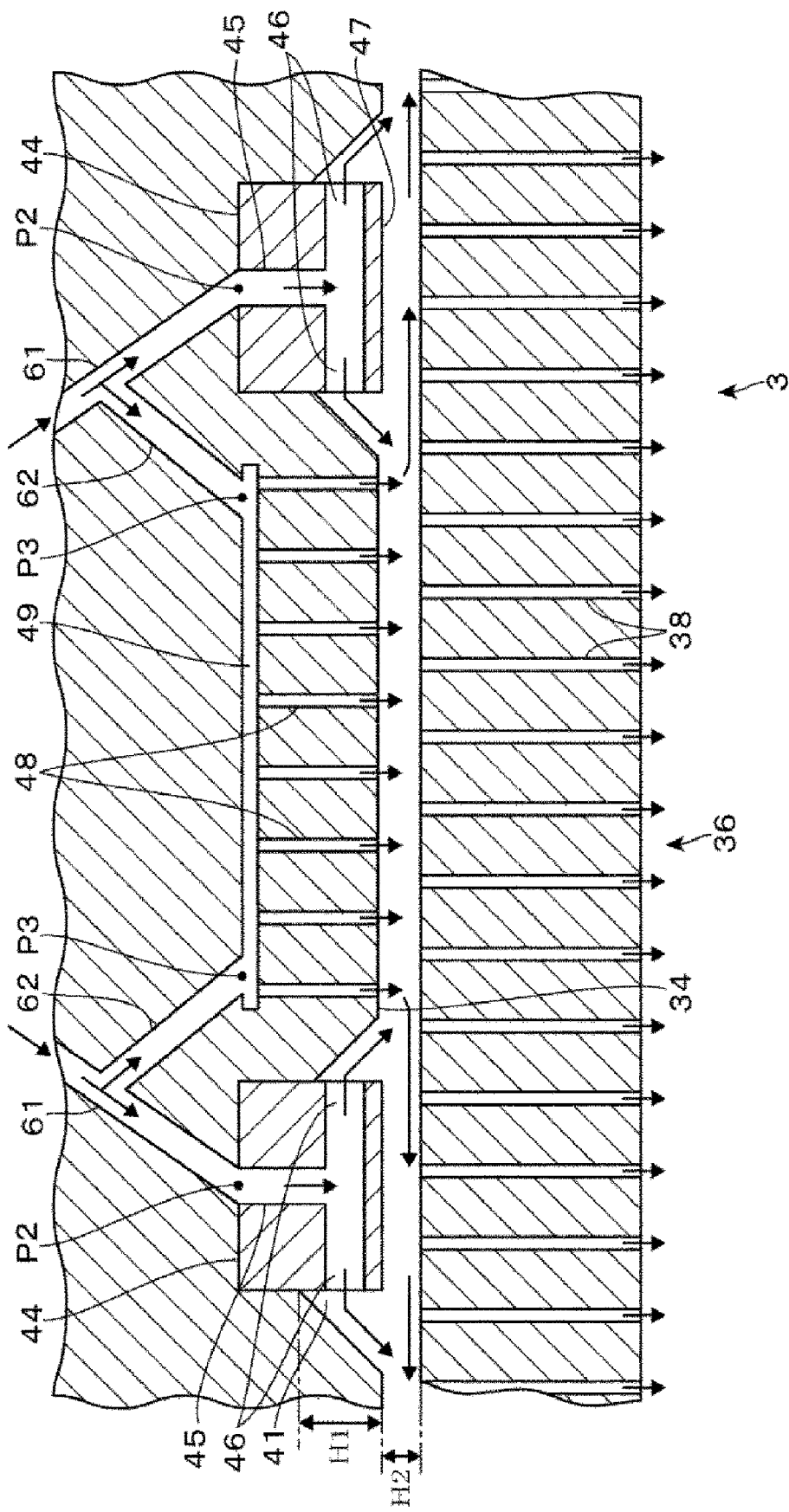
FIG. 4 is a vertical sectional side view of the flow path forming part.

Description will be continued with reference to FIG. 3 which is a plan view of the opposing surface 34 and FIG. 4 which is a vertical sectional side view of the lower side of the gas supply path forming part 3 and the shower plate 36. In FIG. 4, the flow of the gas in the diffusion space 37 and its surroundings is indicated by arrows. As shown in the respective figures, an annular groove 41, i.e., a recess, is formed on the opposing surface 34. The groove 41 is provided along the circumferential direction of the diffusion space 37 so as to surround the central portion of the opposing surface 34. The center of the groove 41 coincides with the center of the opposing surface 34. The outer diameter L1 of the groove 41 shown in FIG. 3 is smaller than the diameter of the wafer W and is, for example, 100 mm to 180 mm. The inner diameter L2 of the groove 41 is, for example, 40 mm to 100 mm. The depth H1 of the groove 41 shown in FIG. 4 is, for example, 3 mm to 8 mm.

Among the two side wall surfaces forming the groove 41, the side wall surface 42 closer to the center of the opposing surface 34 faces toward the peripheral edge of the opposing surface 34 as it goes upward, and the side wall surface 43 near the peripheral edge of the opposing surface 34 faces toward the center of the opposing surface 34 as it goes upward. Accordingly, the side wall surfaces 42 and 43 are inclined with respect to the horizontal plane as seen in the vertical cross section of the groove 41. By forming the side wall surfaces 42 and 43 in this manner, the groove 41 has a wide end so as to be widened as it goes downward. Therefore, the groove 41 is formed such that the opening width thereof decreases as it goes upward. In other words, the groove 41 is configured such that the opening area thereof becomes smaller as it goes upward. The upper surface constituting the groove 41 is, for example, horizontal.

In the groove 41, for example, eight gas dispersion portions 44 are provided at equal intervals in the circumferential direction of the groove 41. Therefore, the gas dispersion portions 44 are buried in the opposing surface 34. The gas dispersion portions 44 are formed in a vertical cylindrical shape. For example, the diameter of the gas dispersion portions 44 are the same size as the width of the upper surface of the groove 41. As shown in FIGS. 1 and 4, the upper end portions of the gas dispersion portions 44 are provided so as to be buried in the upper surface of the groove 41. Therefore, the side wall surfaces 42 and 43 of the groove 41 are formed so as to extend downward from the side walls of the gas dispersion portions 44.

A gas introduction port 45 is formed in the gas dispersion portion 44 so as to extend vertically downward from the central portion of the upper surface of the gas dispersion portion 44. Each of the above-described gases is introduced into the gas introduction port 45 via a gas supply path 5 to be described later. A large number of gas discharge holes 46 connected to the gas introduction port 45 are opened at equal intervals in the circumferential direction of the gas dispersion portion 44 at the position below the upper surface of the groove 41 on the side surface of the gas dispersion portion 44. The gas supplied from the gas introduction port 45 is discharged from the gas discharge holes 46 into the groove 41 in the horizontal direction. In FIG. 3, the flow of the gas discharged from one gas dispersion portion 44 is representatively indicated by arrows. The gas is similarly discharged from the remaining seven gas dispersion portions 44. The gas discharged from the gas dispersion portions 44 in this way is guided toward the side wall surfaces 42 and 43 from the inside of the groove 41 and is supplied to the diffusion space 37. The gas spreads in the lateral direction in the diffusion space 37 and is discharged in a shower shape from the gas supply holes 38 of the shower plate 36 to the wafer W.

Incidentally, a lower surface 47 of the gas dispersion portion 44 is horizontal and is located at the same height as the opposing surface 34. Thus, the gas dispersion portion 44 is provided so as not to protrude from the opposing surface 34. Since the gas dispersion portion 44 does not protrude from the opposing surface 34 as described above, the gas discharged from one gas dispersion portion 44 and spreading in the lateral direction in the diffusion space 37 is prevented from colliding with another gas dispersion portion 44. This makes it possible to prevent the flow of the gas from being hindered and to prevent the gas from stagnating. Accordingly, it is possible to promptly diffuse the gas into the diffusion space 37 with high uniformity. In addition, since the lower surface 47 of the gas dispersion portion 44 is at the same height as the opposing surface 34 and the change in the height of the ceiling surface is suppressed as viewed from the diffusing gas, the gas flows similarly in the region of the diffusion space 37 near the gas dispersion portion 44 and in the remaining region. Therefore, it is possible to diffuse the gas with higher uniformity in the diffusion space 37.

In addition, since the gas dispersion portions 44 are provided in the groove 41 as described above, the height of the diffusion space 37 indicated by H2 in FIG. 4 is small and is, for example, 8 mm or less. By setting the height H2 in this manner, the volume of the diffusion space 37 can be made relatively small. Thus, the raw material gas and the reaction gas remaining in the diffusion space 37 can be quickly purged. Accordingly, it is possible to reduce the time required for one cycle to be described later when performing ALD. This makes it possible to improve the throughput. However, as the height H2 becomes smaller, the gas flowing through the diffusion space 37 is easily affected by a small step difference on the opposing surface 34. Therefore, the height H2 may be in some cases set to, for example, 3 mm or more.

In the region of the opposing surface 34 surrounded by the groove 41, i.e., in the central portion of the opposing surface 34, a large number of gas supply holes 48 are dispersedly formed so as to be opened downward. The upper ends of the gas supply holes 48, as second gas supply holes, are connected to the bottom portion of a flat circular diffusion space 49 provided in the main body portion 31. The diffusion space 49 as a second diffusion space is provided to laterally diffuse the gas supplied from a straight introduction path 62 to be described later. Each of the diffusing gases is discharged in a shower shape from the gas supply holes 48 to the diffusion space 37. Accordingly, the diffusion space 49 is a space commonly provided for the respective gas supply holes 48. The portion where the gas supply holes 48 are formed below the diffusion space 49 is configured as a shower plate 40.

Hereinafter, in order to avoid confusion of explanation, the shower plate 40 and the diffusion space 49 will be sometimes referred to as an upper shower plate 40 and an upper diffusion space 49, respectively, and the above-described shower plate 36 and the above-described diffusion space 37 will be sometimes referred to as a lower shower plate 36 and a lower diffusion space 37, respectively. Similar to the gas discharged from the gas dispersion portions 44, the gas discharged from the upper shower plate 40 is discharged in a shower shape from the gas supply holes 38 of the lower shower plate 36 to the wafer W. The gas supply holes 48 of the upper shower plate 40 and the gas supply holes 38 of the lower shower plate 36 are formed so as not to overlap with each other. By forming the gas supply holes 38 and 48 in this way, the gas discharged from the upper shower plate 40 collides with the upper surface of the lower shower plate 36 and diffuses in the lateral direction in the lower diffusion space 37. Thereafter, the gas is discharged from the lower shower plate 36. Therefore, the concentration of the gas discharged from the central portion of the lower shower plate 36 is restrained from becoming higher than the concentration of the gas discharged from the peripheral edge portion of the lower shower plate 36.

The gas supply path forming part 3 is provided with the gas supply path 5 for supplying the above-described gases to the gas dispersion portions 44 and the upper diffusion space 49. The gas supply path 5 includes introduction paths 51 and 52, a merging path 53, two branch paths 54, a gas introduction diffusion space 55, eight straight introduction paths 61, and eight straight introduction paths 62. The introduction path 51, the introduction path 52, the merging path 53, and the upper side of the branch paths 54 are provided, for example, in the gas introduction portion 32. The lower side of the branch paths 54, the gas introduction diffusion space 55, and the straight introduction paths 61 and 62 are provided, for example, in the main body portion 31 described above. In addition, in the gas supply path 5, the upstream side of the gas introduction diffusion space 55 as a third diffusion space is provided in common to the gas dispersion portions 44 and the upper diffusion space 49. The upstream side of the gas introduction diffusion space 55 is configured as a common flow path 5A including the introduction paths 51 and 52, the merging path 53, and the branch paths 54. The common flow path 5A supplies a gas to the gas dispersion portions 44 and the upper diffusion space 49.

Figure 5:
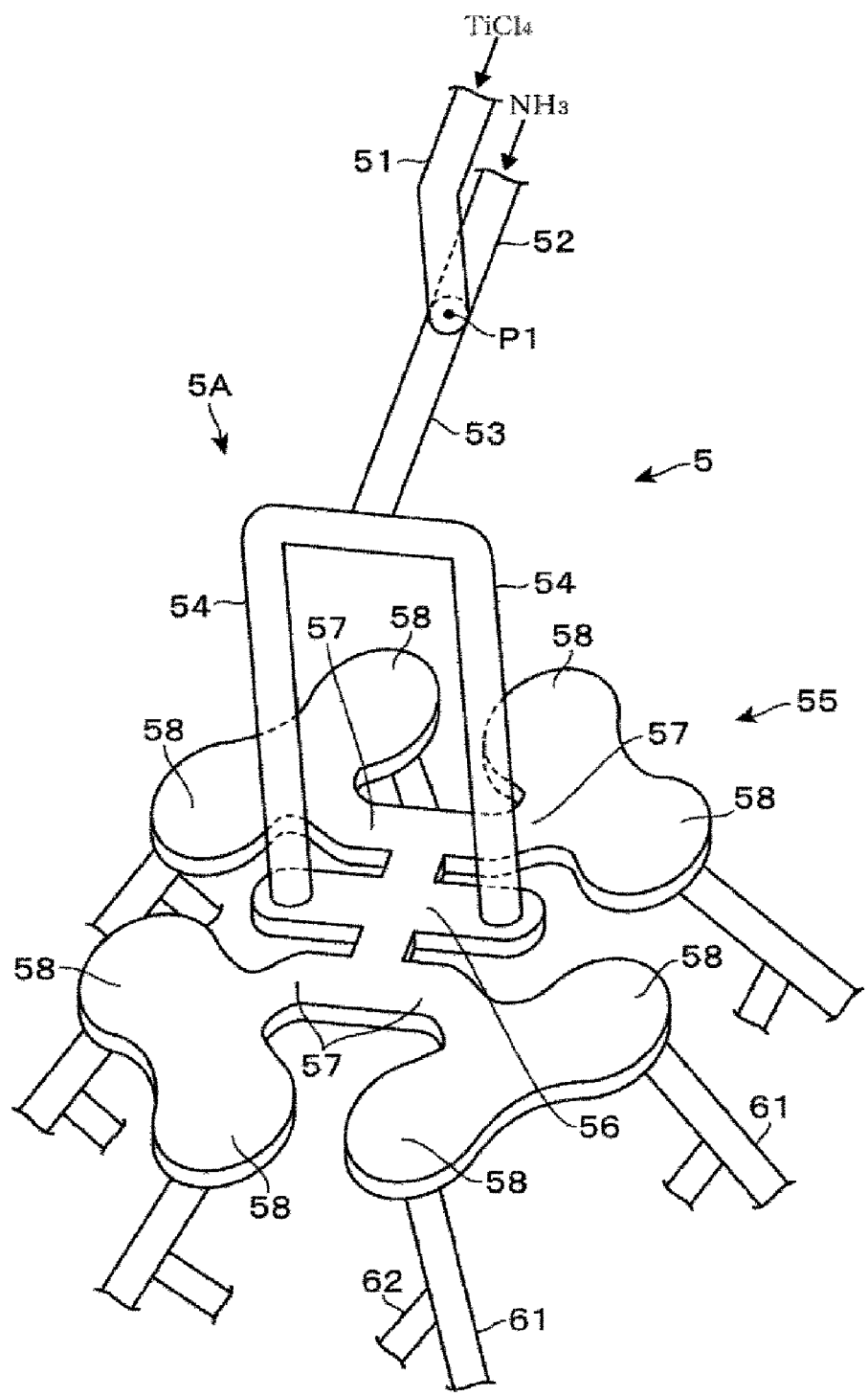
FIG. 5 is a perspective view of a gas flow path provided in the flow path forming part.
Figure 6:
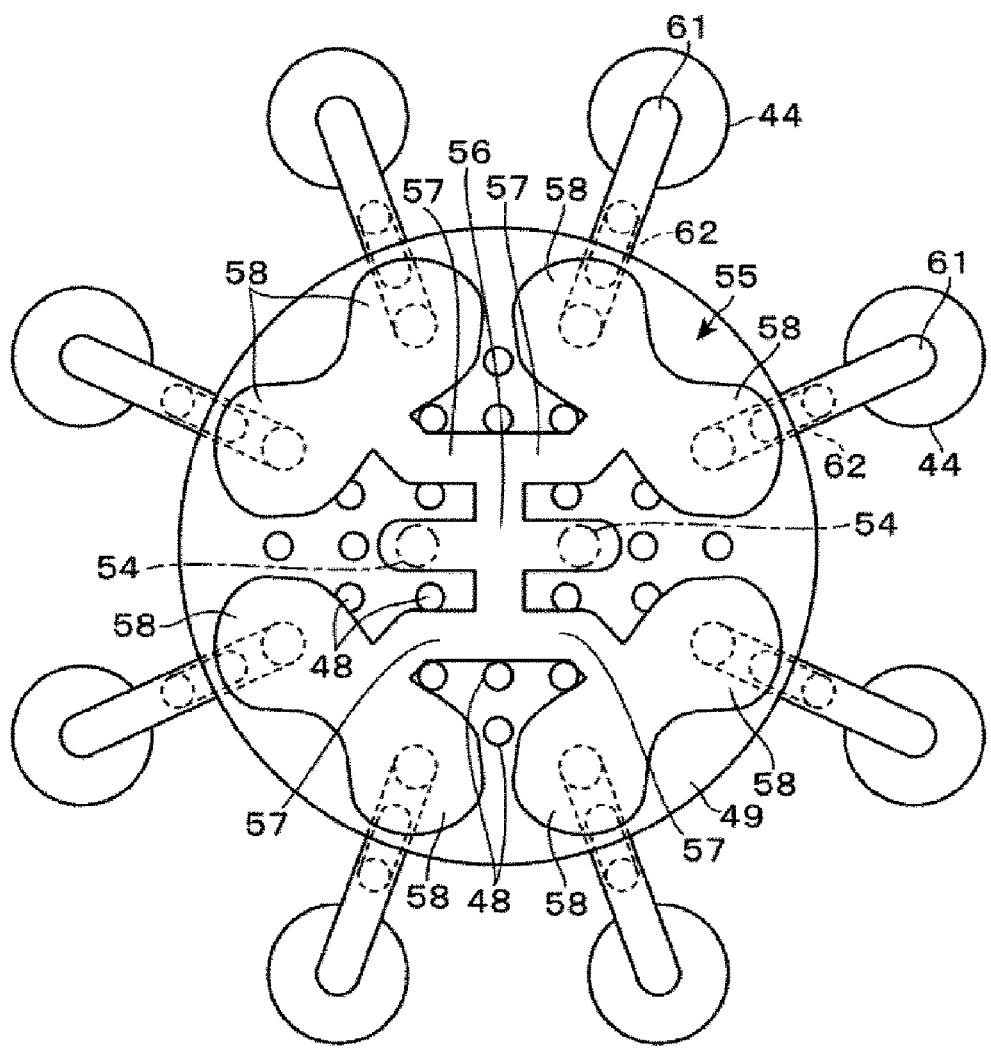
FIG. 6 is a plan view of the gas flow path.
Figure 7:
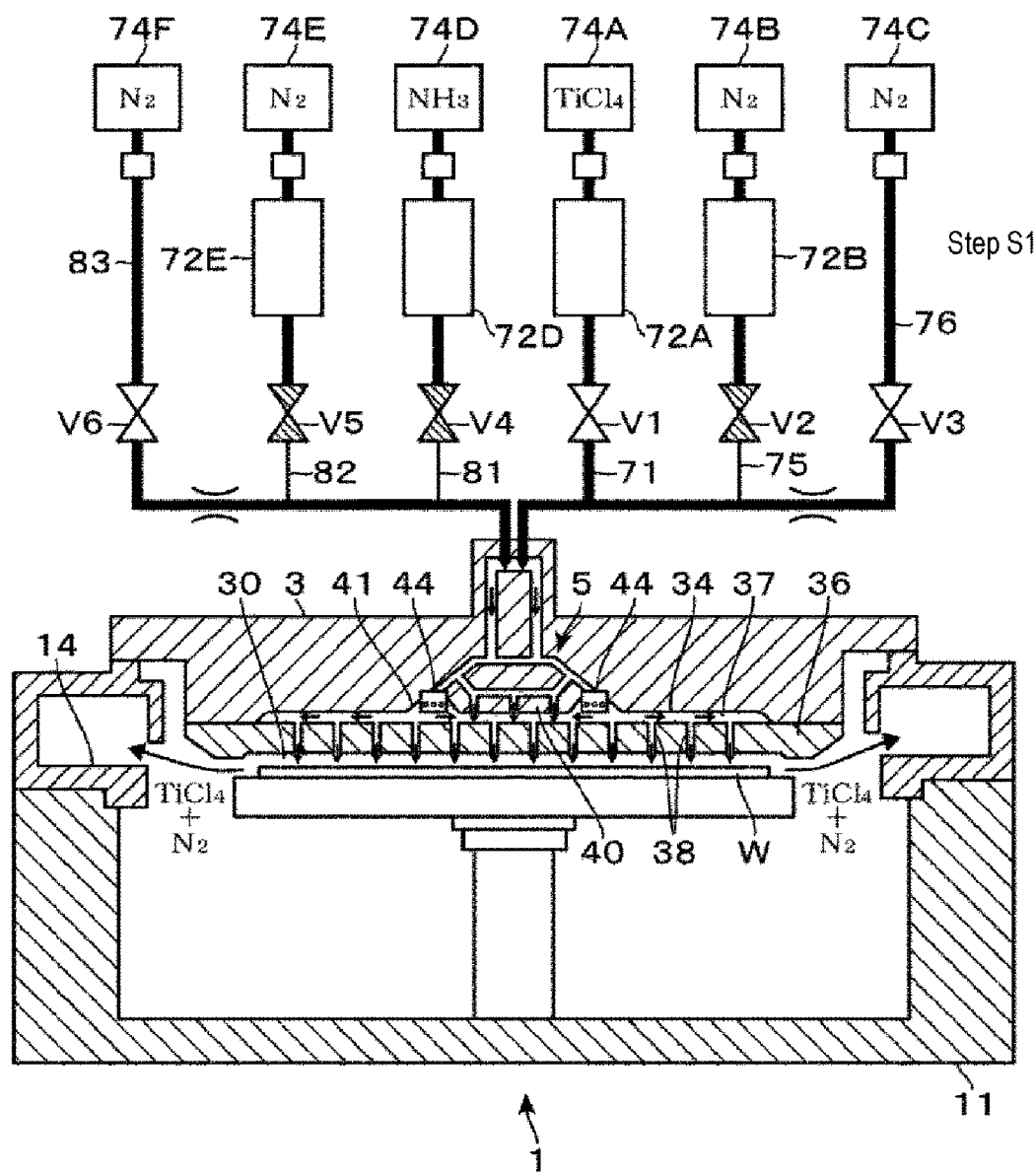
FIG. 7 is a schematic diagram for explaining a process performed by the film forming apparatus.
Figure 8:
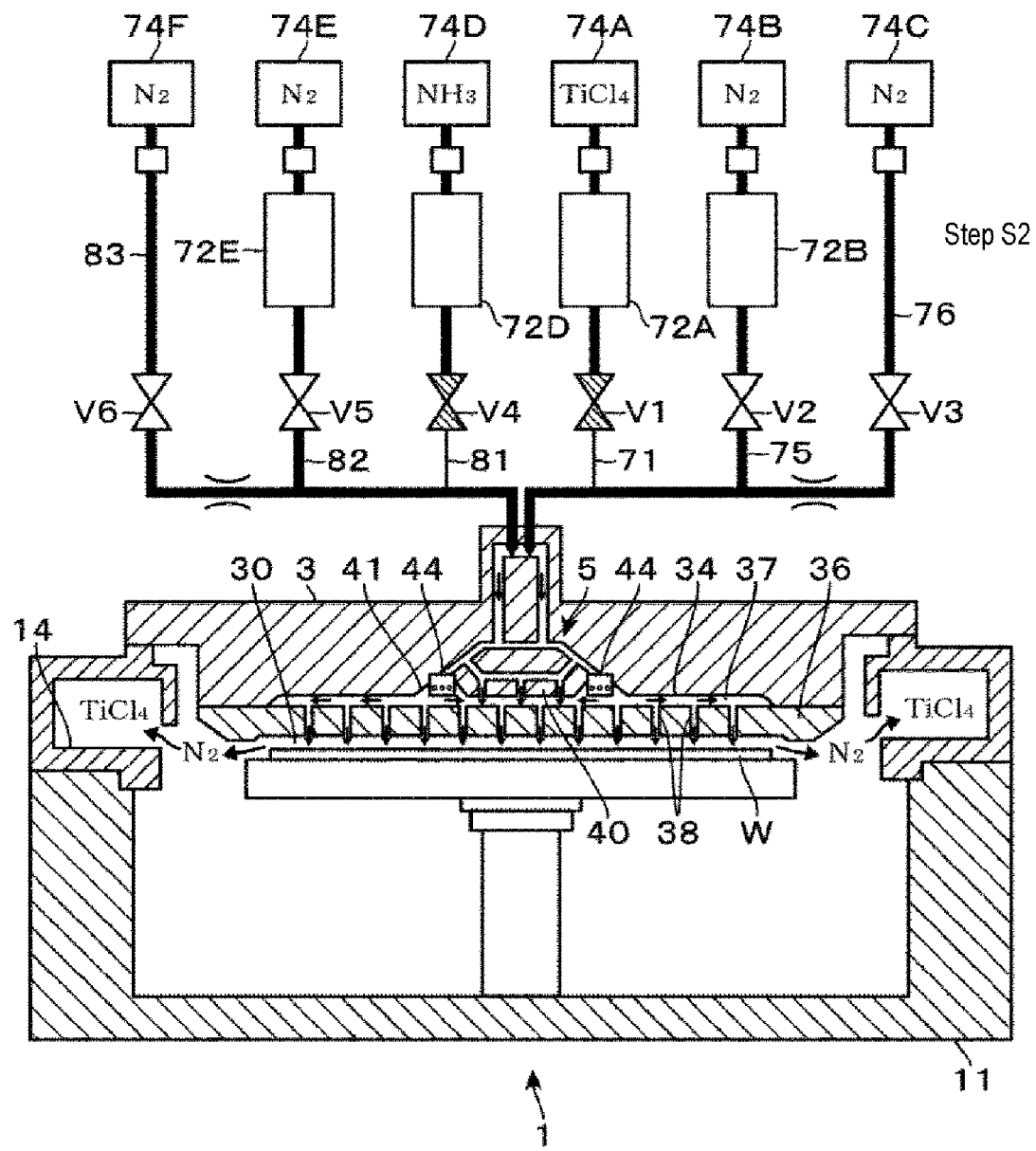
FIG. 8 is a schematic diagram for explaining the process performed by the film forming apparatus.

Description will be made with reference to the perspective view of FIG. 5 and the plan view of FIG. 6 showing the gas supply path 5. As shown in FIG. 5, the introduction paths 51 and 52 are provided so as to extend in the horizontal direction. The introduction paths 51 and 52 are partitioned from each other. A raw material gas, a carrier gas for the raw material gas, and a purge gas are supplied to the upstream side of the introduction path 51. A reaction gas, a carrier gas for the reaction gas, and a purge gas are supplied to the upstream side of the introduction path 52. Accordingly, the introduction path 51 forms a flow path for a raw material gas and a flow path for a replacement gas, and the introduction path 52 forms a flow path for a reaction gas and a flow path for a replacement gas. For example, the introduction path 51 is positioned above the introduction path 52. The downstream side of the introduction path 51 is bent downward and connected to the introduction path 52. Thus, the downstream sides of the introduction paths 51 and 52 are merged together to constitute the above-mentioned merging path 53.

The downstream side of the merging path 53 extends horizontally along the extension direction of the introduction path 52 and then branches to the left and right when viewed in the extension direction, thereby forming the above-described two branch paths 54. The downstream side of each branch path 54 extends in the horizontal direction. Then, the downstream side of each branch path 54 is bent vertically downward and is connected to the flat gas introduction diffusion space 55 at different positions. By branching the downstream side of the merging path 53 into the branch paths 54 and connecting the branch paths 54 to the gas introduction diffusion space 55 in this manner, it is possible to distribute the gas in the gas introduction diffusion space 55 with high uniformity and, consequently, to increase the uniformity of the concentration of each gas in the diffusion space 37. The lengths of the respective branch paths 54 are equal to each other.

The gas introduction diffusion space 55 includes a cross flow path 56 formed by intersecting one straight introduction path and another straight introduction path when seen in a plan view, four branch paths 57, and eight branch ends 58. The downstream ends of the branch paths 54 are connected to one end portion and the other end portion of one straight flow path constituting the cross flow path 56. The lengths from the center of the cross flow path 56 to the downstream ends of the respective branch paths 54 are equal to each other. The central portion of the cross flow path 56 is located on the center portion of the above-described opposing surface 34. Each of the end portions of another straight flow path constituting the cross flow path 56 branches to the left and right when viewed in the extension direction of another straight flow path, thereby forming the branch paths 57.

The upstream side of the branch path 57 extends along one straight introduction path forming the cross flow path 56. The downstream side of the branch path 57 is bent with respect to the upstream side and extends away from the central portion of the cross flow path 56. The downstream end of the branch path 57 branches to the left and right when viewed in the extension direction of the flow path on the downstream side of the branch path 57 and is configured as the branch ends 58. Each of the branch ends 58 is formed to have a wide width when seen in a plan view such that it extends toward the outside of the central portion of the cross flow path 56. The upstream ends of the eight straight introduction paths 61 are connected to the lower portions of the eight branch ends 58, respectively. The lengths from the center of the cross flow path 56 to the respective straight introduction paths 61 are equal to each other. The downstream side of the eight straight introduction paths 61 is formed so as to extend obliquely downward and so as to extend radially in a plan view. The downstream end of the straight introduction path 61 is connected to the gas introduction port 45 of the gas dispersion portion 44. Accordingly, the straight introduction path 61 forms a supply path for supplying a processing gas to the gas dispersion portion 44. The respective straight introduction paths 61 have the same length. The straight introduction path 62 extends obliquely downward from the central portion in the longitudinal direction of each straight introduction path 61. The straight introduction path 62 is formed so as to face toward the center of the opposing surface 34 as seen in a plan view. The downstream ends of the respective straight introduction paths 62 are connected to the peripheral edge portion of the upper diffusion space 49 from the upper side at equal intervals in the circumferential direction. The respective straight introduction paths 62 also have the same length.

The upstream end of the merging path 53, i.e., the downstream ends of the introduction paths 51 and 52 merging with each other, is indicted as a point P1 in FIG. 5. The downstream end of the straight introduction path 61, i.e., the upstream end of the gas introduction port 45 of the gas dispersion portion 44, is indicated as a point P2 in FIG. 4. Since the flow paths constituting the gas supply path 5 are configured as described above, the lengths of the respective flow paths from the point P1 to the respective points P2 are equal to each other. Accordingly, each of the raw material gas, the reaction gas, and the purge gas is simultaneously or substantially simultaneously discharged from the respective gas dispersion portions 44. Therefore, it is possible to suppress occurrence of a difference in the concentration of these gases in the respective parts of the diffusion space 37. As a result, it is possible to improve the in-plane uniformity of the film thickness and to shorten the time required for one ALD cycle by reducing the time required for the purging. As for the respective flow paths extending from the point P1 to the respective points P2, the flow path widths at the positions having same distance from the point P1 may be equal to each other or may be slightly different from each other so that the gas concentration distribution in the diffusion space 37 can be adjusted.

Further, the downstream end of the straight introduction path 62, i.e., the upper end of the gas introduction diffusion space 55, is indicated as a point P3. Since the flow paths constituting the gas supply path 5 are configured as described above, the lengths of the flow paths from the point P1 to the respective points P3 are equal to each other. Moreover, the length of the flow path from the point P1 to the point P3 is the same as the length of the flow path from the point P1 to the point P2. Each of the raw material gas, the reaction gas, and the purge gas is simultaneously or substantially simultaneously discharged from the gas dispersion portions 44 and the upper shower plate 40. Thus, it is possible to more reliably suppress the occurrence of the difference in the gas concentration in the respective parts of the diffusion space 37. Moreover, the fact that the lengths of the flow paths are equal to each other includes the fact that the flow paths are equal in terms of apparatus design. That is to say, even if the lengths of the flow paths are different as a result of the assembly error of the members constituting the apparatus and the processing precision of the members, the lengths of the flow paths are regarded as being equal to each other as long as the lengths of the flow paths are designed to be equal to each other.

Returning to FIG. 1, the description will be continued. The downstream ends of pipes 71 and 81 are respectively connected to the upstream ends of the introduction paths 51 and 52 formed in the gas supply path forming part 3. The upstream end of the pipe 71 is connected to a supply source 74A of a $TiCl_4$ gas as a processing gas via a valve V1, a gas storage tank 72A, and a flow rate adjusting part 73A in this order. The flow rate adjusting part 73A is constituted by a mass flow controller and is configured to adjust the flow rate of the $TiCl_4$ gas supplied from the gas supply source 74A to the downstream side. Other flow rate adjusting parts 73B to 73F, which will be described later, are configured similarly to the flow rate adjusting part 73A and are configured to adjust the flow rate of the gas supplied to the downstream side of a pipe.

The gas storage tank 72A constituting a gas storage part temporarily stores the $TiCl_4$ gas supplied from the gas supply source 74A before supplying the $TiCl_4$ gas into the processing container 11. After the $TiCl_4$ gas is stored in that way and the pressure inside the gas storage tank 72A is increased to a predetermined pressure, the $TiCl_4$ gas is supplied from the gas storage tank 72A to the gas supply path forming part 3. The supply and cutoff of the $TiCl_4$ gas from the gas storage tank 72A to the gas supply path forming part 3 is performed by opening and closing the valve V1. By temporarily storing the $TiCl_4$ gas in the gas storage tank 72A in this way, it is possible to supply the $TiCl_4$ gas to the processing container 11 at a relatively high flow rate. Similar to the gas storage tank 72A, each of the gas storage tanks 72B, 72D and 72E constituting a gas storage part to be described later temporarily stores each gas supplied from the gas supply source on the upstream side of a pipe. By opening and closing the valves V2, V4, and V5 provided on the downstream side of the respective gas storage tanks 72B, 72D, and 72E, the supply and cutoff of the gas from the respective gas storage tanks 72B, 72D, and 72 E to the gas supply path forming part 3 is respectively performed.

The downstream end of a pipe 75 is connected to the downstream side of the valve V1 in the pipe 71. The upstream end of the pipe 75 is connected to an $N_2$ gas supply source 74B via the valve V2, the gas storage tank 72B, and the flow rate adjusting part 73B in this order. Further, the downstream end of a pipe 76 is connected to the downstream side of the valve V2 in the pipe 75. The upstream end of the pipe 76 is connected to an $N_2$ gas supply source 74C via a valve V3 and the flow rate adjusting part 73C in this order.

Next, the pipe 81 will be described. The upstream end of the pipe 81 is connected to an $NH_3$ gas supply source 74D via the valve V4, the gas storage tank 72D, and the flow rate adjusting part 73D in this order. The downstream end of a pipe 82 is connected to the downstream side of the valve V4 in the pipe 81. The upstream end of the pipe 82 is connected to an $N_2$ gas supply source 74E via the valve V5, the gas storage tank 72E, and the flow rate adjusting part 73E in this order. Further, the downstream end of a pipe 83 is connected to the downstream side of the valve V5 in the pipe 82. The upstream end of the pipe 83 is connected to an $N_2$ gas supply source 74F via a valve V6 and the flow rate adjusting part 73F in this order.

An orifice 77 is formed on the downstream side of the valve V3 in the pipe 76, and an orifice 78 is formed on the downstream side of the valve V6 in the pipe 83. Due to the formation of the orifice 77, the diameter of the pipe 76 on the downstream side of the valve V3 is smaller than the diameter of the pipe 76 on the upstream side of the valve V3 and the diameter of the pipes 71 and 75. Thus, each gas supplied at a relatively large flow rate via the gas storage tanks 72A and 72B is prevented from flowing backward through the pipe 76. Furthermore, due to the formation of the orifice 78, the diameter of the pipe 83 on the downstream side of the valve V6 is smaller than the diameter of the pipe 83 on the upstream side of the valve V6 and the diameter of the pipes 81 and 82. Thus, each gas supplied at a relatively large flow rate via the gas storage tanks 72D and 72E is prevented from flowing backward through the pipe 83.

Incidentally, the $N_2$ gas supplied from the $N_2$ gas supply sources 74B and 74E is supplied into the processing container 11 in order to perform the purging as described above. The $N_2$ gas supplied from the $N_2$ gas supply sources 74C and 74F is a carrier gas for a $TiCl_4$ gas and an $NH_3$ gas, respectively. The carrier gas is continuously supplied into the processing container 11 during the processing of the wafer W. Therefore, the carrier gas is also supplied into the processing container 11 when the purging is performed. Accordingly, the time period during which the carrier gas is supplied into the processing container 11 overlaps with the time period during which the $N_2$ gas from the gas supply sources 74B and 74E is supplied into the processing container 11 in order to perform the purging. Thus, the carrier gas is also used for the purging. However, for the convenience of explanation, the gas supplied from the $N_2$ gas supply sources 74B and 74E will be described as a purge gas, and the gas supplied from the $N_2$ gas supply sources 74C and 74F will be described as a carrier gas.

Further, the film forming apparatus 1 includes the controller 10. The controller 10 is constituted by a computer and is provided with a program, a memory, and a CPU. In the program, a group of steps is incorporated so that a series of operations to be described later can be executed in the film forming apparatus 1. By virtue of the program, the controller 10 outputs control signals to the respective parts of the film forming apparatus 1, whereby the operation of each part is controlled. Specifically, the respective operations such as the opening and closing of the valves V1 to V6, the adjustment of the gas flow rate by the flow rate adjusting parts 73A to 73F, the adjustment of the pressure inside the processing container 11 by the pressure regulation mechanism 18, the adjustment of the temperature of the wafer W by the heater 22, and the like are controlled by the control signals. The program is stored in a storage medium such as a compact disk, a hard disk, a DVD, or the like and is installed in the controller 10.

Figure 11:
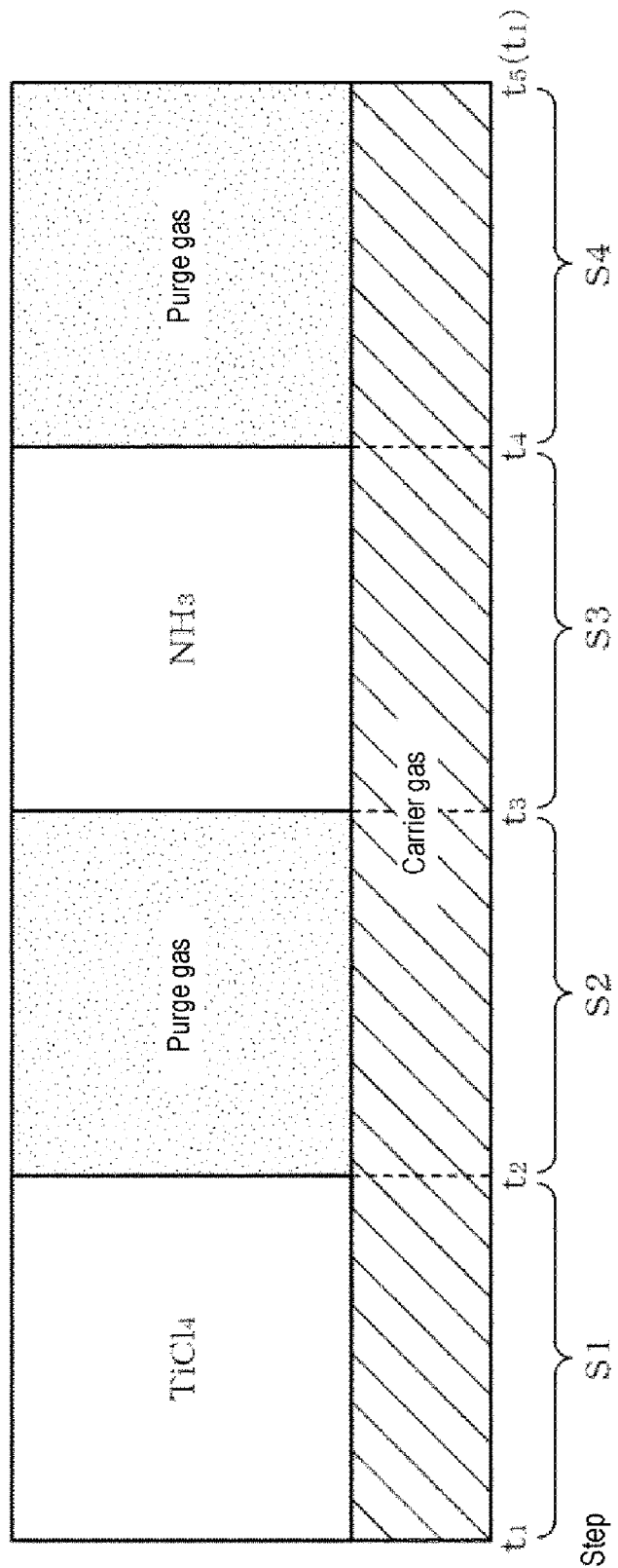
FIG. 11 is a timing chart of the process performed by the film forming apparatus.

Next, the film forming process in the film forming apparatus 1 will be described with reference to FIGS. 7 to 10 showing the opening and closing states of the respective valves and the flowing states of the gases in the respective pipes. In FIGS. 7 to 10, valves in a closed state are hatched to distinguish them from valves in an open state. Regarding the pipes 71, 75, 76, and 81 to 83, portions where the gases are flowing toward the downstream side is shown thicker than portions where the gases are not flowing. In FIGS. 7 to 10, for the sake of avoiding complication of the drawings, the upstream side of the gas supply path 5 is simplified in comparison with FIG. 1. In addition, reference is appropriately made to FIG. 11 which is a timing chart showing the time period during which the respective gases are supplied.

First, while keeping the valves V1 to V6 in a closed state, the wafer W is transferred into the processing container 11 by the transfer mechanism and is mounted on the mounting table 21 at the delivery position. After the transfer mechanism is retracted from the inside of the processing container 11, the gate valve 13 is closed. The wafer W is heated to the aforementioned temperature by the heater 22 of the mounting table 21. The mounting table 21 is moved up to the processing position to form the processing space 30. The pressure inside the processing container 11 is adjusted so as to become a predetermined vacuum pressure by the pressure regulation mechanism 18 installed in the exhaust pipe 16.

Then, the valves V3 and V6 are opened, and the carrier gas ($N_2$ gas) is supplied to the gas supply path 5 from the $N_2$ gas supply sources 74C and 74F, respectively. On the other hand, the $TiCl_4$ gas and the $NH_3$ gas are supplied from the gas supply source 74A and the gas supply source 74D to the pipes 71 and 81. Since the valves V1 and V4 are closed, the $TiCl_4$ gas and the $NH_3$ gas are respectively stored in the gas storage tanks 72A and 72D, and the pressure in the gas storage tanks 72A and 72D is increased. Thereafter, the valve V1 is opened (time t1 in the chart). The $TiCl_4$ gas stored in the gas storage tank 72A is supplied to the gas supply path 5 and is discharged from the gas dispersion portions 44 and the upper shower plate 40 into the lower diffusion space 37. The $TiCl_4$ gas discharged from the gas dispersion portions 44 diffuses in the lateral direction in the lower diffusion space 37 without the flow of the $TiCl_4$ gas being hindered by the gas dispersion portions 44 as described above. The $TiCl_4$ gas is supplied from the upper shower plate 40 to the central portion of the lower diffusion space 37.

As described above, the $TiCl_4$ gas is supplied from the gas dispersion portions 44 and the upper shower plate 40. Thus, in a short time from the start of the supply of the $TiCl_4$ gas, the $TiCl_4$ gas is distributed at a highly uniform concentration in the respective parts of the lower diffusion space 37. The $TiCl_4$ gas is supplied from the lower shower plate 36 to the wafer W and is adsorbed to the wafer W with high uniformity in the plane of the wafer W. In parallel with the supply of the $TiCl_4$ gas to the wafer W in the processing container 11, the purge gas ($N_2$ gas) is supplied to the pipes 75 and 82 from the gas supply sources 74B and 74E, respectively. Since the valves V2 and V5 are closed, the purge gas is stored in the gas storage tanks 72B and 72E. Thus, the pressure inside the gas storage tanks 72B and 72E is increased (step S1 in FIG. 7).

Thereafter, the valve V1 is closed and the valves V2 and V5 are opened (time t2). The supply of the $TiCl_4$ gas into the processing container 11 is stopped. The purge gas stored in the gas storage tanks 72B and 72E is supplied to the gas supply path 5. Just like the $TiCl_4$ gas, the purge gas is discharged from the gas dispersion portions 44 and the shower plate 40 to the lower diffusion space 37. Accordingly, just like the $TiCl_4$ gas, the purge gas discharged from the gas dispersion portions 44 diffuses in the lateral direction in the lower diffusion space 37 without the flow of the purge gas being hindered by the gas dispersion portions 44.

As described above, the purge gas is discharged from the gas dispersion portions 44 and the shower plate 40. Thus, in a short time from the start of the supply of the purge gas, the purge gas is distributed at a highly uniform concentration in the respective parts of the lower diffusion space 37. The purge gas is supplied to the wafer W from the lower shower plate 36. As a result, the $TiCl_4$ gas remaining in the processing space 30 without being adsorbed to the wafer W is simultaneously or substantially simultaneously removed from above the respective portions in the plane of the wafer W, and the adsorption of the $TiCl_4$ gas to the wafer W is stopped. The $TiCl_4$ gas is purged to the exhaust duct 14 and is removed from the processing container 11. While the purging is performed in this manner, the valve V1 is closed so that the $TiCl_4$ gas supplied from the gas supply source 74A to the pipe 71 is stored in the gas storage tank 72A. Thus, the pressure inside the gas storage tank 72A is increased (step S2 in FIG. 8).

Subsequently, the valves V2 and V5 are closed and the valve V4 is opened (time t3). Thus, the supply of the purge gas to the gas supply path 5 is stopped. The $NH_3$ gas stored in the gas storage tank 72D is supplied to the gas supply path 5 and is discharged from the gas dispersion portions 44 and the shower plate 40 to the lower diffusion space 37. Just like the $TiCl_4$ gas and the purge gas, the $NH_3$ gas is distributed at a highly uniform concentration in the respective parts of the lower diffusion space 37. The $NH_3$ gas is supplied from the lower shower plate 36 to the processing space 30. Thus, the $NH_3$ gas is highly uniformly supplied to the respective parts in the plane of wafer W. As a result, the nitriding reaction of the $TiCl_4$ gas adsorbed with high uniformity in the plane of the wafer W proceeds, and a thin layer of TiN is formed as a reaction product. On the other hand, since the valves V2 and V5 are closed, the purge gas supplied from the gas supply sources 74B and 74E to the pipes 75 and 82, respectively, is stored in the gas storage tanks 72B and 72E.

Figure 9:
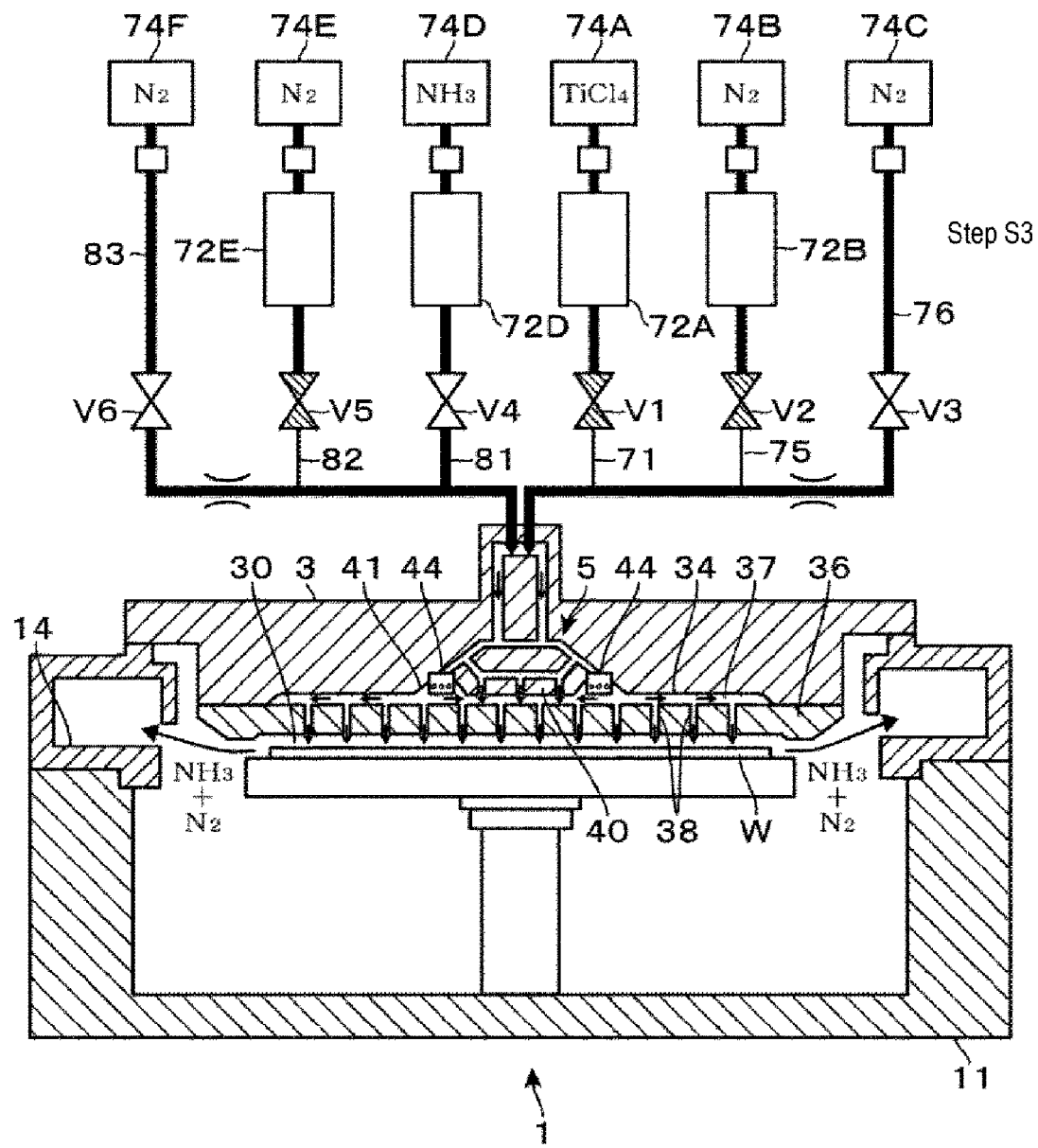
FIG. 9 is a schematic diagram for explaining the process performed by the film forming apparatus.
Figure 10:
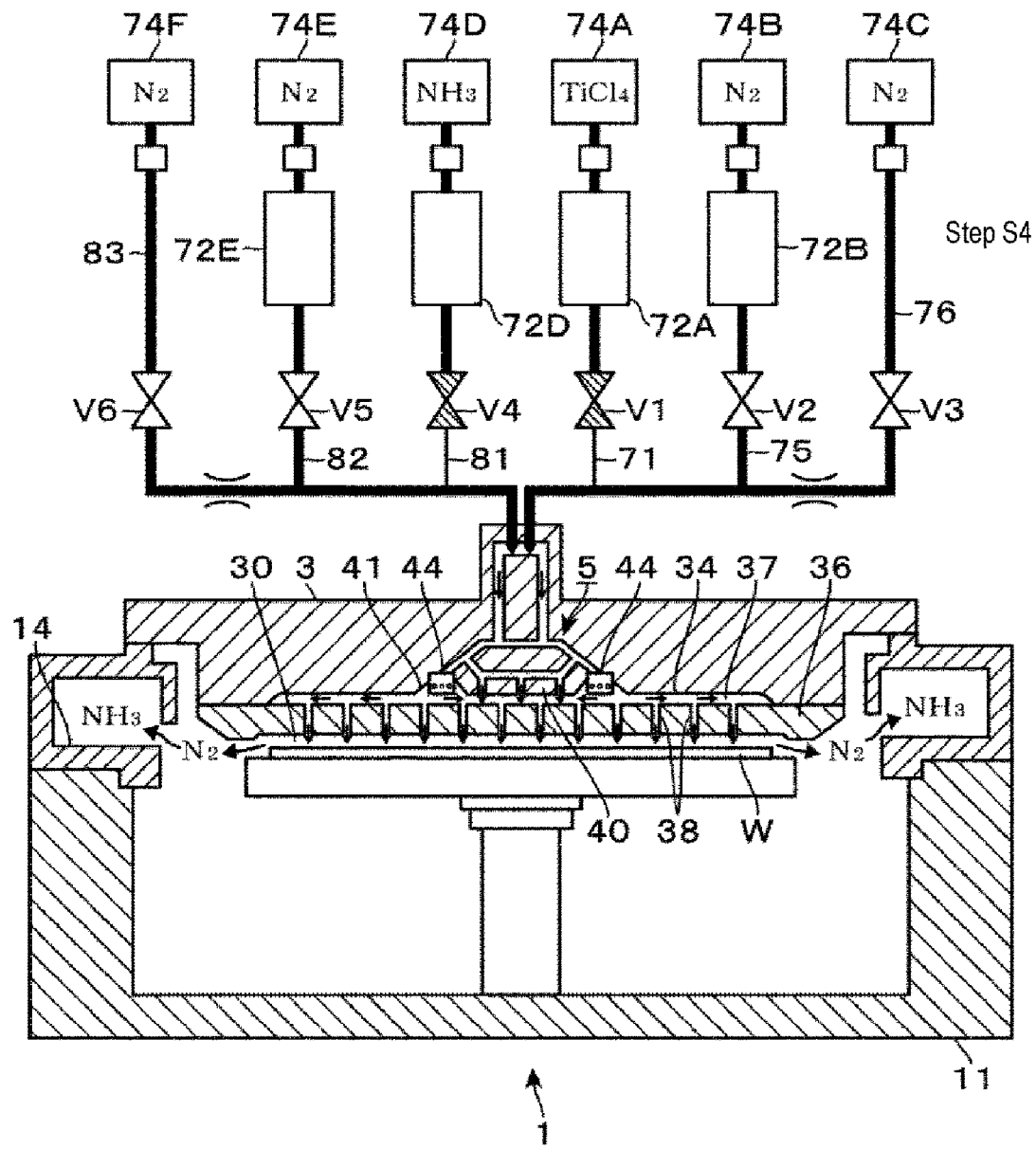
FIG. 10 is a schematic diagram for explaining the process performed by the film forming apparatus.

Thus, the pressure inside the gas storage tanks 72B and 72E is increased (step S3 in FIG. 9).

Thereafter, the valve V4 is closed and the valves V2 and V5 are opened (time t4). The supply of the $NH_3$ gas into the processing container 11 is stopped. The purge gas stored in the gas storage tanks 72B and 72E is supplied to the gas supply path 5. As in step S2, the purge gas is discharged from the gas dispersion portions 44 and the shower plate 40 to the lower diffusion space 37 and is discharged from the lower shower plate 36. As a result, the unreacted $NH_3$ gas remaining in the processing space 30 is simultaneously or substantially simultaneously removed from above the respective parts in the plane of the wafer W to stop the nitriding reaction, whereby the thickness of a thin layer of TiN is made uniform in the respective parts in the plane of the wafer W. The $NH_3$ gas is purged to the exhaust duct 14 and is removed from the processing container 11. While the purging is performed in this manner, the valve V4 is closed so that the $NH_3$ gas supplied from the gas supply source 74D to the pipe 81 is stored in the gas storage tank 72D. Thus, the pressure inside the gas storage tank 72D is increased (step S4 in FIG. 10).

After a lapse of a predetermined time from the time t4, the valves V2 and V5 are closed and the valve V1 is opened (time t5). The supply of the purge gas into the processing container 11 is stopped and the $TiCl_4$ stored in the gas storage tank 72A is supplied to the gas supply path 5. That is to say, the above-described step S1 is performed again. Thus, the time t5 at which the purging is completed is also the time t1 at which the supply of the $TiCl_4$ gas is started. After the step S1 is performed, the above-described steps S2 to S4 are performed. Thereafter, the steps S1 to S4 are further performed. Assuming that the above steps S1 to S4 are one cycle, this cycle is repeatedly performed. Thus, thin layers of TiN are deposited on the surface of the wafer W, and a TiN film is formed. When a predetermined number of cycles are executed, the wafer W is unloaded from the processing container 11 in a procedure reverse to the procedure at the time of loading the wafer W into the processing container 11.

According to this film forming apparatus 1, the annular groove 41 is formed so as to surround the central portion of the opposing surface 34 facing the shower plate 36, and the eight gas dispersion portions 44 are provided in the groove 41 at intervals in the circumferential direction of the opposing surface 34 so as not to protrude from the flat opposing surface 34. With such a configuration, the flow of the gas spreading in the lateral direction in the lower diffusion space 37 is prevented from being hindered by the gas dispersion portions 44. Thus, in a short time from the supply of the gas into the lower diffusion space 37, it is possible to increase the uniformity of the concentration of the gas in the respective parts of the lower diffusion space 37. This makes it possible to supply the gas to the surface of the wafer W through the shower plate 36 with high uniformity. As a result, a TiN film can be formed so as to have a uniform film thickness in the plane of the wafer W.

Meanwhile, when heating and processing the wafer W at a relatively high temperature within a range of 400 degrees C. to 700 degrees C., the flow rate of the raw material gas supplied into the processing container 11 may be in some cases made relatively large in order to increase the in-plane uniformity of the film thickness of the wafer W and to increase the coverage of the TiN film in the respective parts in the plane of the wafer W. The gas storage tanks 72B and 72E are provided so that even when the raw material gas is supplied at such a relatively large flow rate, the raw material gas can be purged within a short time by supplying the purge gas to the gas supply path forming part 3 at a relatively large flow rate.

As shown in the evaluation tests to be described later, if the gas dispersion portions 44 protrude from the opposing surface 34 when the purge gas having such a relatively large flow rate is supplied to the lower diffusion space 37, the uniformity of the film thickness in the plane of the wafer W tends to deteriorate. However, by providing the gas dispersion portions 44 as described above, such a problem can be prevented. That is to say, in the case of supplying the purge gas via the gas storage tanks 72B and 72E in the above manner, it is particularly effective to provide the gas dispersion portions 44 so as not to protrude from the opposing surface 34 as described above. Even when the purge gas is supplied without going through the gas storage tanks 72B and 72E, this is effective because, by providing the gas dispersion portions 44 so as not to protrude from the opposing surface 34, it is possible to increase the uniformity of the concentration of the purge gas in the lower diffusion space 37. Although an example is illustrated in which the $TiCl_4$ gas and the $NH_3$ gas are also supplied via the gas storage tanks 72A and 72D in order to improve the throughput by supplying the $TiCl_4$ gas and the $NH_3$ gas to the gas supply path forming part 3 at a relatively large flow rate, the $TiCl_4$ gas and the $NH_3$ gas may be supplied without going through such gas storage tanks 72A and 72D.

Figure 12:
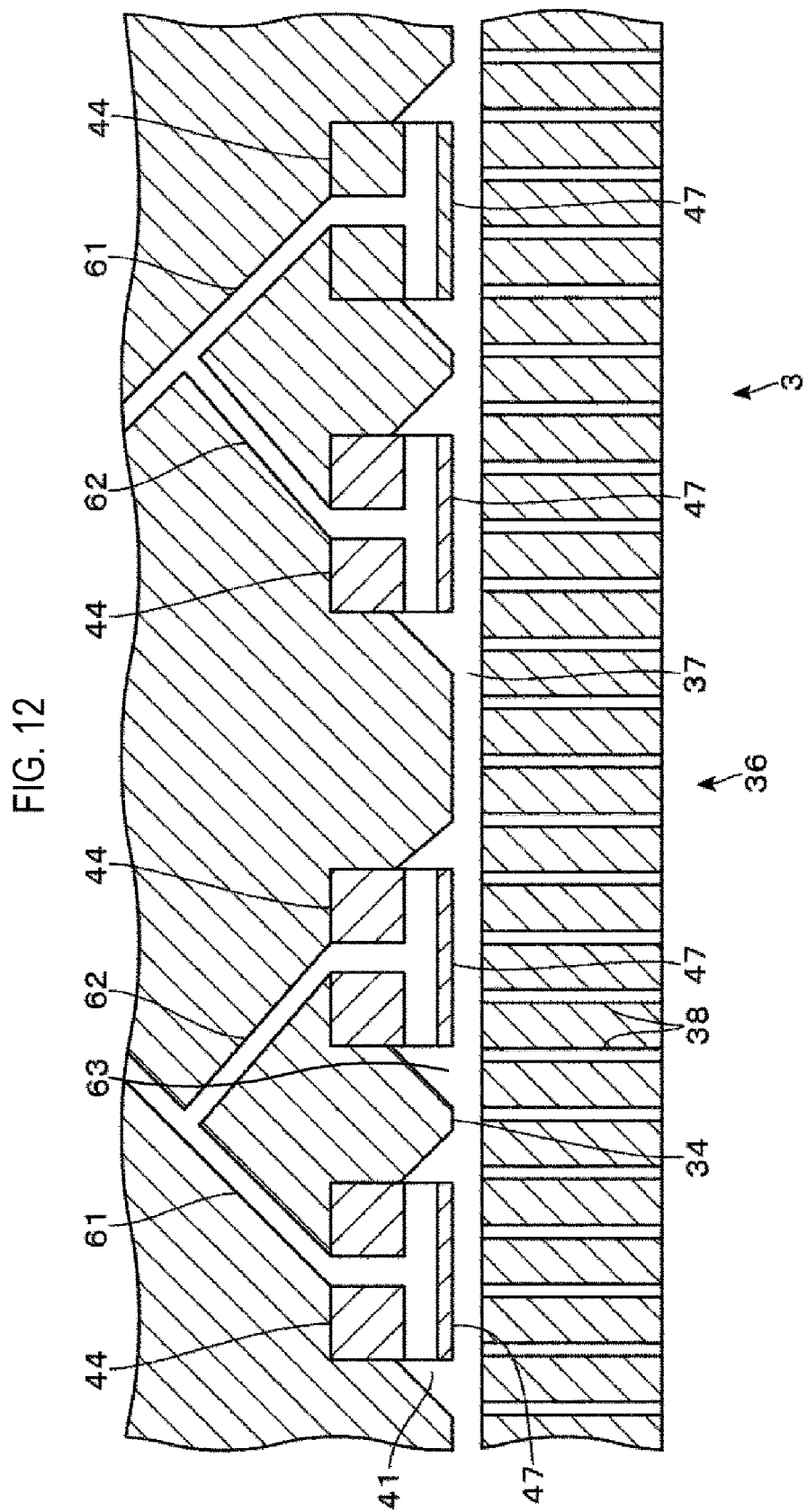
FIG. 12 is a vertical sectional side view showing another configuration example of the flow path forming part.

Incidentally, FIG. 12 shows another configuration example of the gas supply path forming part 3. The difference from the configuration example described with reference to FIGS. 1 and 4 is as follows. In the gas supply path forming part 3 shown in FIG. 12, the upper shower plate 40 and the upper diffusion space 49 are not provided, and an annular groove 63 having a center coinciding with the center of the opposing surface 34 is provided at the inner side of the groove 41. Accordingly, the grooves 41 and 63 are formed concentrically. The groove 63 is configured similarly to the groove 41 except for its size. A plurality of, for example, four gas dispersion portions 44 are provided in the groove 63 at equal intervals in the circumferential direction. The gas is supplied from the straight introduction path 62 to the gas dispersion portions 44 in the groove 63. Similar to the lower surfaces 47 of the gas dispersion portions 44 in the groove 41, the lower surfaces 47 of the gas dispersion portions 44 in the groove 63 are formed horizontally at the same height as the opposite surface 34. That is to say, in the gas supply path forming part 3 shown in FIG. 12, the gas is supplied to the central portion of the lower diffusion space 37 by the respective gas dispersion portions 44 provided in the grooves 41 and 63.

In this way, the gas dispersion portions 44 may be provided in the groove 63. However, according to the configuration shown in FIG. 12, the gas dispersion portions 44 are disposed at a position closer to the center of the opposing surface 34. Thus, the collision and interference state of the gas flowing in the lateral direction in the vicinity of the central portion of the opposing surface 34 is changed by the small difference in the flow rate of the gas discharged from the respective gas dispersion portions 44. Therefore, the uniformity of the concentration of the gas in the central portion of the lower diffusion space 37 may be decreased due to such a change in the collision and interference state of the gas. In other words, the configuration in which the gas is discharged downward by the upper shower plate 40 can suppress the problem due to such collision and interference of the gas. Therefore, in the configuration in which the gas is discharged downward by the upper shower plate 40, the concentration of the gas in the lower diffusion space 37 can be made more uniform because the film formation process can be more reliably performed with high uniformity in the plane of the wafer W.

Figure 13:
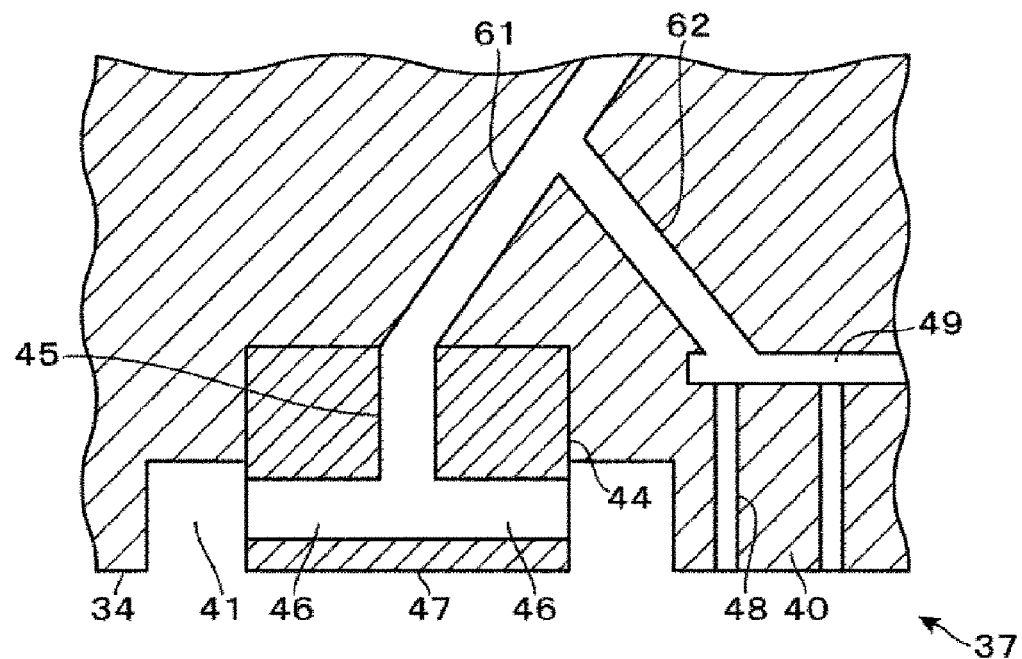
FIG. 13 is a vertical sectional side view showing another configuration example of a groove provided in the flow path forming part.

The groove 41 in which the gas dispersion portions 44 are provided will be further described. The magnitude of each inclination of the side wall surfaces 42 and 43 when the groove 41 is viewed in the vertical cross section may be appropriately set to adjust the gas distribution in the lower diffusion space 37. Accordingly, the magnitude of the inclination of the side wall surface 42 and the magnitude of the inclination of the side wall surface 43 are not limited to being the same, but may be different from each other. Furthermore, as shown in FIG. 13, the side wall surfaces 42 and 43 of the groove 41 when viewed in the vertical cross section may be vertically formed at the positions distant from the gas dispersion portions 44. Accordingly, the groove 41 is not limited to being formed so as to be widened downward, i.e., to be narrowed upward as described above. However, by forming the groove 41 so as to be narrowed upward as described above, it is possible to reduce the volume inside the groove 41. That is to say, it is possible to prevent an increase in the volume required for replacement of the atmosphere by the purge gas. This makes it possible to suppress the prolonging of the time necessary for purging and to improve the throughput.

Figure 14:
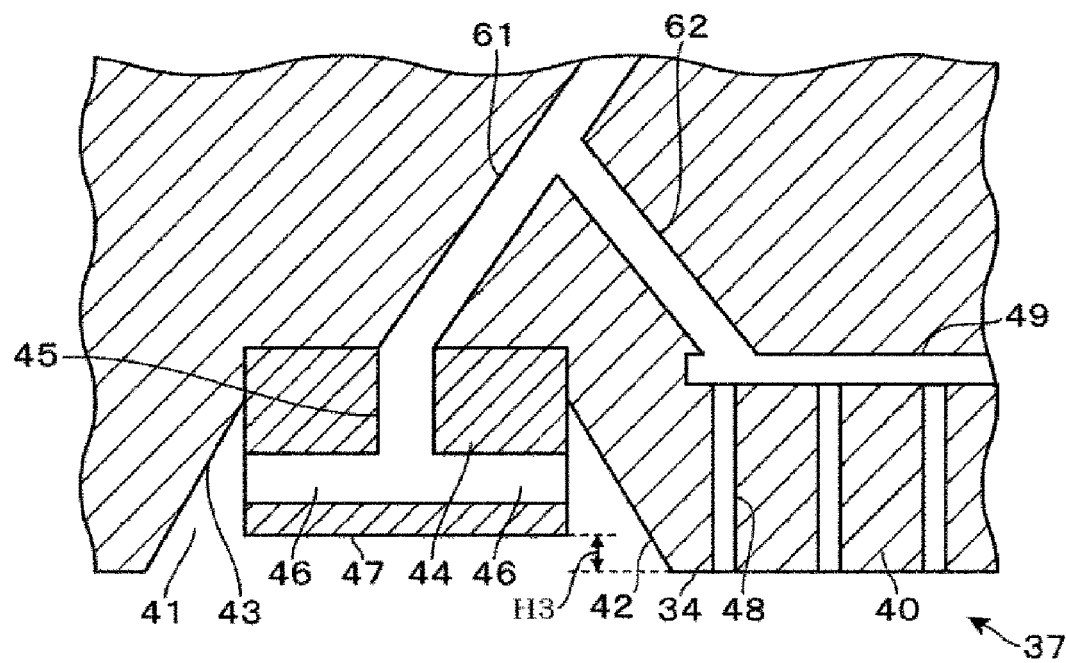
FIG. 14 is an explanatory view showing a positional relationship between the groove and a gas dispersion portion provided in the flow path forming part.

In addition, the fact that the gas dispersion portions 44 do not protrude from the opposing surface 34 is not limited to the configuration in which the lower surfaces 47 of the gas dispersion portions 44 are positioned at the same height as the opposing surface 34, but may include a configuration in which as shown in FIG. 14, the lower surfaces 47 of the gas dispersion portions 44 are positioned higher than the opposing surface 34. However, if a height difference H3 between the lower surfaces 47 of the gas dispersion portions 44 and the opposing surface 34 is too large, the flow of the gas in the lower diffusion space 37 may be disturbed due to the height difference H3, and the uniformity of the gas supplied to the respective parts in the plane of the wafer W may be deteriorated. Therefore, in order to prevent such a problem, the height difference H3 may be in some cases set to, for example, 3 mm or less.

Figure 15:
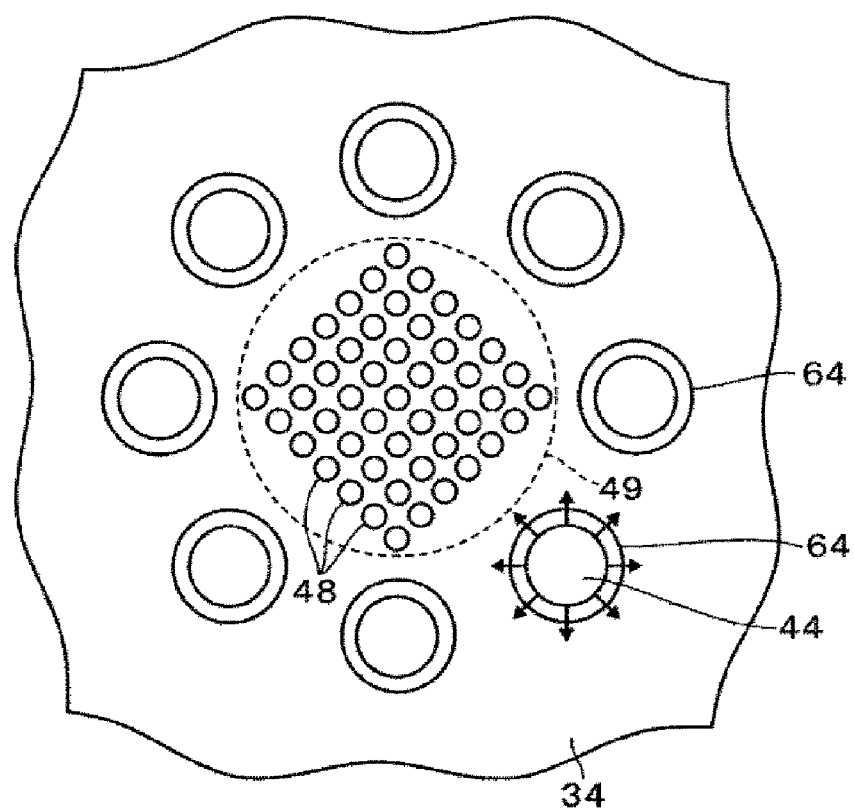
FIG. 15 is a plan view showing another configuration example of the opposing surface.

FIG. 15 shows another configuration example of the opposing surface 34. In the opposing surface 34 shown in FIG. 15, the groove 41 is not provided, and eight circular recesses 64 are provided at intervals along the circumferential direction of the opposing surface 34 so as to surround the shower plate 40. The gas dispersion portions 44 are provided in the respective recesses 64 so as not to protrude from the opposing surface 34. Accordingly, the recess for accommodating the gas dispersion portions 44 is not limited to the annular groove. In order to reduce the volume inside the recesses 64, the recesses 64 may be formed so that the diameter thereof grows smaller upward and, consequently, the opening area becomes smaller upward. In FIG. 15, as in FIG. 3, the flow of the gas discharged from one gas dispersion portion 44 is representatively indicated by arrows. The gas is similarly discharged from the remaining seven gas dispersion portions 44.

The film forming apparatus for performing ALD has been described as an embodiment of the present disclosure. However, the present disclosure may also be applied to a film forming apparatus for carrying out CVD. In that case as well, the film formation can be performed by highly uniformly supplying the processing gas to the respective parts in the plane of the wafer W. Moreover, the type of the gas used is not limited to the above-described example. In addition, the present disclosure is not limited to being applied to the film forming apparatus, but may also be applied to an etching apparatus that performs etching by supplying a processing gas to a wafer W. The present disclosure is not limited to the above-described example. The above-described embodiments may be appropriately changed or combined.

Evaluation Test

Hereinafter, evaluation tests conducted in connection with the present disclosure will be described.

Evaluation Test 1

In evaluation test 1-1, the distribution of the film thickness in the plane of the wafer W when a film forming process is performed according to the steps S1 to S4 described with reference to FIGS. 7 to 10 using the film forming apparatus 1 described with reference to FIG. 1 and the like was examined. Thus, in the film forming apparatus 1 used in the evaluation test 1-1, the gas dispersion portions 44 are provided in the groove 41 and do not protrude from the opposing surface 34. However, the purge gas was supplied to the gas dispersion portions 44 at a relatively small flow rate per unit time without going through the above-described gas storage tanks 72B and 72E. The time necessary for one cycle was set to 0.38 seconds. In evaluation test 1-2, a film forming process was performed under the same conditions as in the evaluation test 1-1 except that the purge gas is supplied via the above-described gas storage tanks 72 B and 72E and the flow rate of the purge gas supplied to the gas supply path forming part 3 per unit time is larger than that of the evaluation test 1-1. The distribution of the film thickness in the plane of the wafer W was examined.

In comparative test 1-1 and comparative test 1-2, tests were conducted substantially in the same manner as in the evaluation test 1-1 and the evaluation test 1-2, respectively. The difference between the comparative tests 1-1 and 1-2 and the evaluation tests 1-1 and 1-2 resides in that the groove 41 is not formed on the opposing surface 34 in the film forming apparatus used in the comparative tests 1-1 and 1-2 and a plurality of gas dispersion portions 44 is provided along the concentric circles having the center coinciding with the center of the opposing surface 34 so as to protrude from the opposing surface 34.

Figure 16:
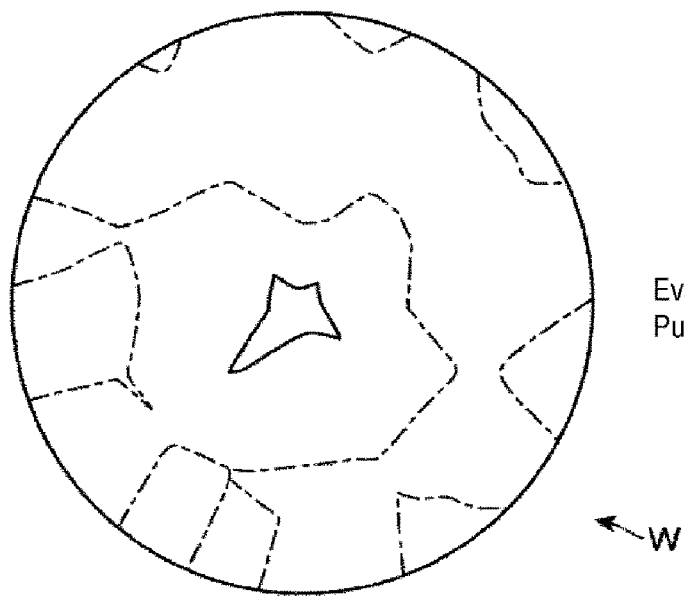
FIG. 16 is a schematic diagram of a wafer for showing the result of an evaluation test.
Figure 17:
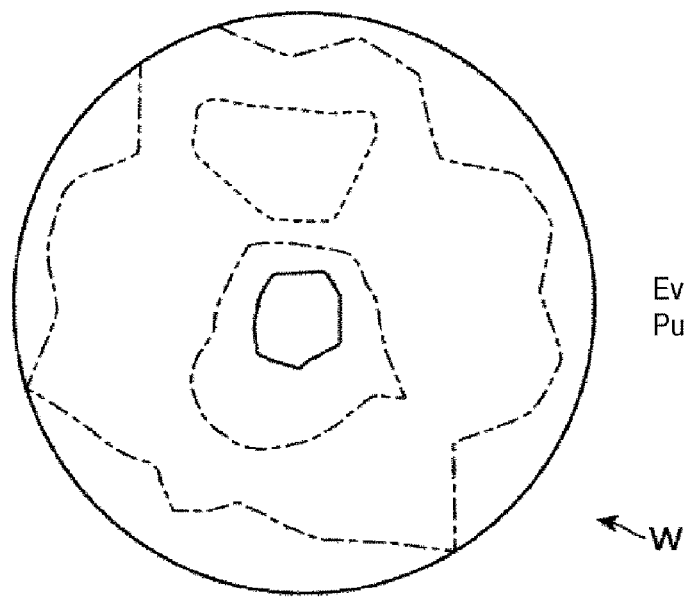
FIG. 17 is a schematic diagram of a wafer for showing the result of an evaluation test."
Figure 18:
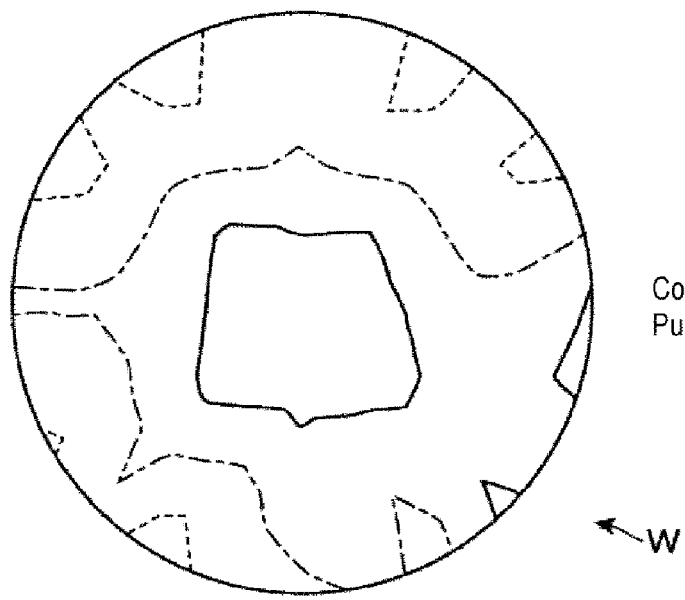
FIG. 18 is a schematic diagram of a wafer for showing the result of an evaluation test.
Figure 19:
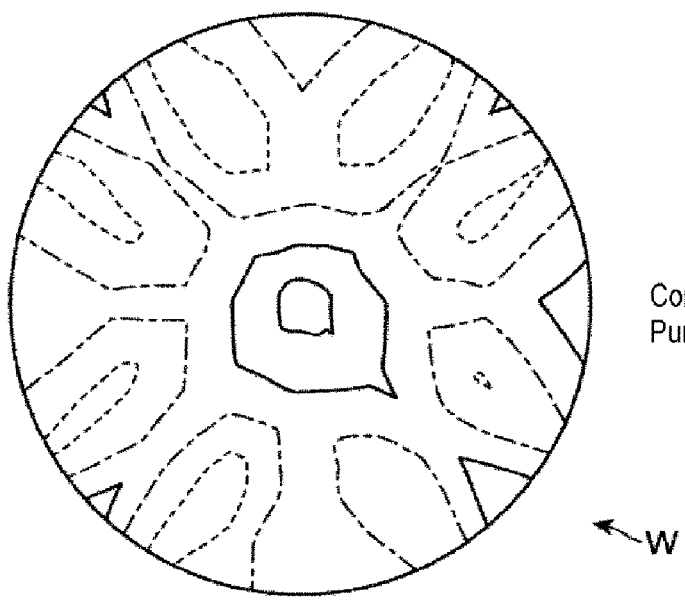
FIG. 19 is a schematic diagram of a wafer for showing the result of an evaluation test.

FIGS. 16 and 17 are plan views of the wafer W respectively showing the results of the evaluation tests 1-1 and 1-2, and FIGS. 18 and 19 are plan views of the wafer W respectively showing the results of the comparative tests 1-1 and 1-2. In FIGS. 16 to 19, the points having predetermined film thicknesses in the plane of the wafer W are connected by a solid line, a dotted line, and a chain line, respectively. The solid line connects the points having a relatively large film thickness, the chain line connects the points having a smaller film thickness than the points connected by the solid line, and the dotted line connects the points having a smaller film thickness than the points connected by the chain line. Accordingly, the solid line, the chain line, and the dotted line are contour lines for indicating the film thickness distribution by surrounding and partitioning the region having the same film thickness. In each test, the average value of the film thickness and the film thickness range (the maximum value of the film thickness—the minimum value of the film thickness) were measured.

Comparing the evaluation test 1-1 and the comparative test 1-1 with reference to FIGS. 16 and 18, the regions respectively surrounded by the solid line, the chain line, and the dotted line appear in the comparative test 1-1. However, only the regions surrounded by the solid line and the chain line appear in the evaluation test 1-1. The average value of the film thicknesses was 104.7 Å in the evaluation test 1-1 and was 103.8 Å in the comparative test 1-1. The film thickness range was 2.0 Å in the evaluation test 1-1 and was 3.5 Å in the comparative test 1-1. As described above, there is no large difference in average film thickness between the evaluation test 1-1 and the comparative test 1-1. It was confirmed that the uniformity of the film thickness in the plane of the wafer W is higher in the evaluation test 1-1 than in the comparative test 1-1. Thus, the effect of the present disclosure was confirmed.

Comparing the evaluation test 1-2 and the comparative test 1-2 with reference to FIGS. 17 and 19, in the comparative test 1-2, the regions having a low film thickness surrounded by the dotted lines dispersedly appear in the circumferential direction of the wafer W. The positions of the regions surrounded by the dotted lines correspond to the positions where the gas dispersion portions 44 are provided. In other words, it is presumed that the uniformity of the film thickness has decreased because the gas flow was hindered by the gas dispersion portions 44. In contrast to the comparative test 1-2, in the evaluation test 1-2, it can be seen that the change in the film thickness is suppressed as seen in the circumferential direction of the wafer W. The average value of the film thickness was 101.2 Å in the evaluation test 1-2 and was 100.8 Å in the comparative test 1-2. The range of the film thickness was 3.6 Å in the evaluation test 1-2 and was 4.7 Å in the comparative test 1-2. As described above, there is no large difference in average film thickness between the evaluation test 1-2 and the comparative test 1-2. It was confirmed that the uniformity of the film thickness in the plane of the wafer W is higher in the evaluation test 1-2 than in the comparative test 1-2.

Evaluation Test 2

In evaluation test 2, as in the evaluation test 1-2 described above, a TiN film forming process was performed by supplying a purge gas at a relatively large flow rate, and the film thickness at the respective parts in the plane of the wafer W was measured. Thus, in the evaluation test 2, use is made of the film forming apparatus 1 in which the gas dispersion portions 44 do not protrude from the opposing surface 34 as described with reference to FIG. 1 and the like. In comparative test 2, as in the comparative test 1-2 described above, a TiN film forming process was performed by supplying a purge gas at a relatively large flow rate, and the film thickness at the respective parts in the plane of the wafer W was measured. Thus, in the comparative test 2, use is made of the film forming apparatus in which the gas dispersion portions 44 protrude from the opposing surface 34. In addition, in the film forming apparatus used in the comparative test 2, the configuration of the gas supply path 5 described with reference to FIG. 5 is slightly different from that of the film forming apparatus 1 used in the evaluation test 2, and the downstream side of the merging path 53 is connected to the gas introduction diffusion space 55 without being branched. In both the evaluation test 2 and the comparative test 2, the time necessary for one cycle was set to 0.38 seconds.

In addition, the measurement points of the film thickness in the evaluation test 2 and the comparative test 2 are the center point of the wafer W and the points on three concentric circles having a center coinciding with the center point. The three concentric circles include a first circle, a second circle, and a third circle disposed from the inside to the outside. The radius of the second circle is approximately twice as large as the radius of the first circle, and the radius of the third circle is approximately three times as large as the radius of the first circle. The third circle is located on the peripheral edge portion of the wafer W. In the first circle, the second circle, and the third circle, the numbers of the measurement points are set to 8, 16, and 24, respectively. The measurement points located in the same circle are disposed at equal intervals in the circumferential direction. In order to distinguish the respective measurement points, numbers are given. The measurement point at the center of the wafer W is designated by 1, the measurement points of the first circle are designated by 2 to 9, the measurement points of the second circle are designated by 10 to 25, and the measurement points of the third circle are designated by 26 to 49.

The graph of FIG. 20 shows the above test results. The horizontal axis indicates the designated number of the measurement points described above, and the vertical axis indicates the film thickness (unit: Å). The result of the evaluation test 2 is indicated by giving circular plots in the graph and connecting the respective plots with a solid line. The result of the comparative test 2 is indicated by giving triangular plots in the graph and connecting the respective plots with a dotted line. As is apparent from the graph, the variation in the film thickness between the measurement points is suppressed in the evaluation test 2 as compared with the comparative test 2. Accordingly, it was also confirmed from the evaluation test 2 that the film thickness uniformity in the plane of the wafer W can be increased by preventing the gas dispersion portions 44 from protruding from the opposing surface 34. In addition, it is considered that in the gas supply path 5, the branching the downstream side of the merging path 53 and the connecting the branched paths to the gas introduction diffusion space 55 contribute to the increase in the uniformity of the film thickness.

According to the present disclosure, a recess is provided around the central portion of a flat opposing surface which faces a gas supply part for supplying a processing gas to a substrate in a shower shape from above and which defines a diffusion space for diffusing the processing gas in a lateral direction. A plurality of gas dispersion portions, each of which has a plurality of gas discharge holes extending along a circumferential direction, is provided in the recess around the central portion of the opposing surface without protruding from the opposing surface. With such a configuration, hindrance of the flow of the processing gas in the diffusion space is suppressed. This makes it possible to perform gas processing with high uniformity in the plane of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas processing apparatus for performing a process by supplying a processing gas to a substrate in a processing chamber kept in a vacuum atmosphere, comprising:

a mounting part located in the processing chamber and configured to mount the substrate on the mounting part;

a gas supply part located above the mounting part to constitute a ceiling portion of the processing chamber, the gas supply part having a plurality of first gas supply holes for supplying the processing gas;

a gas supply path forming part including:

a plurality of supply paths for the processing gas,
a flat opposing surface which faces the gas supply part from above and defines a first diffusion space for diffusing the processing gas in a lateral direction,
a plurality of second gas supply holes opened downward at a central portion of the flat opposing surface so that the plurality of second gas supply holes are connected downward to the first diffusion space, and
a second gas diffusion space which is provided commonly to the plurality of second gas supply holes and is connected to upstream sides of the plurality of second gas supply holes;
an annular groove extending along a circumference of the central portion of the flat opposing surface so that the central portion is lower than the annular groove; and
a plurality of gas dispersion portions located in the annular groove surrounding the central portion of the flat opposing surface without protruding from the flat opposing surface, each of the plurality of gas dispersion portions having a plurality of gas discharge holes opened in a horizontal direction and opened at intervals in a circumferential direction of the gas dispersion portion at a position below an upper surface of the annular groove and above the flat opposing surface so as to discharge the processing gas from the plurality of gas discharge holes into the annular groove in the horizontal direction,
wherein the plurality of supply paths includes:
a plurality of first straight introduction paths extending obliquely downward and extending radially in a plan view, each downstream end of the plurality of first straight introduction paths being connected to each upstream end of the plurality of gas dispersion portions; and
a plurality of second straight introduction paths extending obliquely downward, each of the plurality of second straight introduction paths extending from a central portion in a longitudinal direction of each of the plurality of first straight introduction paths toward the central portion of the flat opposing surface in a plan view, each downstream end of the plurality of second straight introduction paths being connected to the second gas diffusion space, and
wherein lengths of flow paths extending from each upstream end of the plurality of first straight introduction paths to the each downstream end of the plurality of first straight introduction paths are the same as lengths of flow paths extending from the each upstream end of the plurality of first straight introduction paths to the each downstream end of the plurality of second straight introduction paths.

2. The gas processing apparatus of claim 1, wherein the gas supply path forming part includes a common flow path commonly connected to the plurality of supply paths and the plurality of second gas supply holes to introduce the processing gas into the plurality of supply paths and the plurality of second gas supply holes and supplied with the processing gas from an upstream side.

3. The gas processing apparatus of claim 2, wherein the plurality of second gas supply holes are configured to supply the processing gas to the first diffusion space,
wherein the gas supply path forming part allows the processing gas to be diffused in the lateral direction and to be supplied to the plurality of second gas supply holes, and
wherein the common flow path is configured to supply the processing gas to the plurality of supply paths and the second gas diffusion space.

4. The gas processing apparatus of claim 2, wherein the plurality of first gas supply holes and the plurality of second gas supply holes do not overlap with each other.

5. The gas processing apparatus of claim 3, wherein the gas processing apparatus is a film forming apparatus configured to form a film by sequentially supplying, through a plurality of cycles, a raw material gas that is the processing gas, a replacement gas that replaces an atmosphere, and a reaction gas that reacts with the raw material gas and produces a reaction product on the substrate, and
wherein a flow path for the raw material gas, a flow path for the reaction gas, and a flow path for the replacement gas are connected to an upstream side of each of the plurality of supply paths of the processing gas.

6. The gas processing apparatus of claim 5, wherein lengths of flow paths extending from a merging point of the flow path for the raw material gas and the flow path for the reaction gas to the each of the plurality of gas dispersion portions are equal to each other.

7. The gas processing apparatus of claim 6, wherein the plurality of second gas supply holes, the second gas diffusion space, and the common flow path are provided in the gas supply path forming part, and
wherein the lengths of the flow paths extending from the merging point to the each of the plurality of gas dispersion portions and a length of a flow path extending from the merging point to the second gas diffusion space are equal to each other.

8. The gas processing apparatus of claim 6, wherein the each of the plurality of supply paths is provided for the each of the plurality of gas dispersion portions,
wherein the gas supply path forming part includes:
a third gas diffusion space configured to laterally diffuse the processing gas to supply the processing gas to each of the plurality of supply paths; and
branch paths formed at a downstream side of the merging point and configured to supply the processing gas, the reaction gas, and the replacement gas to different positions in the third gas diffusion space.

9. The gas processing apparatus of claim 5, further comprising:
a gas storage part located in the flow path for the replacement gas and configured to store the replacement gas; and
a valve located on a downstream side of the gas storage part in the flow path for the replacement gas, and configured to be opened and closed so as to allow the replacement gas to be supplied from the gas storage part to the processing chamber after the replacement gas is stored in the gas storage part and a pressure inside the gas storage part is increased.

10. The gas processing apparatus of claim 1, wherein an opening area of the annular groove decreases upward.

* * * * *